US010510598B2

(12) United States Patent
Hsieh et al.

(10) Patent No.: US 10,510,598 B2
(45) Date of Patent: Dec. 17, 2019

(54) SELF-ALIGNED SPACERS AND METHOD FORMING SAME

(71) Applicant: Taiwan Semiconductor Manufacturing Company, Ltd., Hsin-Chu (TW)

(72) Inventors: Yi-Tsang Hsieh, Hsin-Chu (TW); Cha-Hsin Chao, Taipei (TW); Yi-Wei Chiu, Kaohsiung (TW); Li-Te Hsu, Shanhua Township (TW); Ying Ting Hsia, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/386,952

(22) Filed: Dec. 21, 2016

(65) Prior Publication Data

US 2018/0174904 A1   Jun. 21, 2018

Related U.S. Application Data

(60) Provisional application No. 62/427,477, filed on Nov. 29, 2016.

(51) Int. Cl.
*H01L 21/768* (2006.01)
*H01L 29/78* (2006.01)
(Continued)

(52) U.S. Cl.
CPC .. *H01L 21/76897* (2013.01); *H01L 21/76831* (2013.01); *H01L 23/485* (2013.01);
(Continued)

(58) Field of Classification Search
CPC .......... H01L 21/76897; H01L 23/5283; H01L 29/785; H01L 29/6656; H01L 21/76832;
(Continued)

(56) References Cited

U.S. PATENT DOCUMENTS

| 5,929,524 A | * | 7/1999 | Drynan | ............. H01L 21/76816 |
| | | | | 257/758 |
| 5,939,746 A | * | 8/1999 | Koyama | ........... H01L 27/10852 |
| | | | | 257/306 |

(Continued)

FOREIGN PATENT DOCUMENTS

| JP | 2001174850 A | 6/2001 |
| JP | 2011228578 A | 11/2011 |

(Continued)

*Primary Examiner* — Jarrett J Stark
(74) *Attorney, Agent, or Firm* — Slater Matsil, LLP

(57) ABSTRACT

A method includes forming a bottom source/drain contact plug in a bottom inter-layer dielectric. The bottom source/drain contact plug is electrically coupled to a source/drain region of a transistor. The method further includes forming an inter-layer dielectric overlying the bottom source/drain contact plug. A source/drain contact opening is formed in the inter-layer dielectric, with the bottom source/drain contact plug exposed through the source/drain contact opening. A dielectric spacer layer is formed to have a first portion extending into the source/drain contact opening and a second portion over the inter-layer dielectric. An anisotropic etching is performed on the dielectric spacer layer, and a remaining vertical portion of the dielectric spacer layer forms a source/drain contact spacer. The remaining portion of the source/drain contact opening is filled to form an upper source/drain contact plug.

20 Claims, 26 Drawing Sheets

(51) Int. Cl.
*H01L 29/66* (2006.01)
*H01L 29/417* (2006.01)
*H01L 23/485* (2006.01)

(52) U.S. Cl.
CPC .. *H01L 29/41766* (2013.01); *H01L 29/41791* (2013.01); *H01L 29/66545* (2013.01); *H01L 29/66795* (2013.01); *H01L 29/785* (2013.01); *H01L 29/7851* (2013.01); *H01L 29/665* (2013.01); *H01L 29/6656* (2013.01)

(58) Field of Classification Search
CPC ......... H01L 21/47573; H01L 29/66795; H01L 29/0649; H01L 21/475; H01L 29/6653
See application file for complete search history.

(56) References Cited

U.S. PATENT DOCUMENTS

| | | | |
|---|---|---|---|
| 6,165,880 A | 12/2000 | Yaung et al. | |
| 6,180,430 B1 | 1/2001 | Kong et al. | |
| 7,612,360 B2 | 11/2009 | Lee et al. | |
| 7,667,271 B2 | 2/2010 | Yu et al. | |
| 7,910,453 B2 | 3/2011 | Xu et al. | |
| 8,264,022 B2 | 9/2012 | Yoon et al. | |
| 8,295,080 B2 | 10/2012 | Aizawa et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,896,068 B2* | 11/2014 | Mayuzumi | H01L 21/28518 257/369 |
| 9,105,490 B2 | 8/2015 | Wang et al. | |
| 9,355,935 B2 | 5/2016 | Chen et al. | |
| 9,425,094 B2 | 8/2016 | Chen et al. | |
| 9,852,947 B1* | 12/2017 | Ko | H01L 21/76802 |
| 9,966,309 B2* | 5/2018 | Ting | H01L 21/76837 |
| 10,121,873 B2* | 11/2018 | Liao | H01L 21/28123 |
| 2002/0140101 A1* | 10/2002 | Yang | H01L 21/76802 257/762 |
| 2005/0258499 A1* | 11/2005 | Huang | H01L 21/28052 257/382 |
| 2006/0131630 A1* | 6/2006 | Sun | H01L 21/76897 257/296 |
| 2009/0224327 A1* | 9/2009 | Liou | H01L 29/517 257/368 |
| 2009/0236583 A1 | 9/2009 | Kuo et al. | |
| 2010/0270627 A1* | 10/2010 | Chang | H01L 21/28247 257/411 |
| 2011/0092019 A1* | 4/2011 | Yu | H01L 21/76808 438/106 |
| 2011/0237040 A1* | 9/2011 | Ng | H01L 21/823425 438/303 |
| 2012/0139015 A1* | 6/2012 | Yu | H01L 21/28518 257/288 |
| 2013/0049219 A1* | 2/2013 | Tsai | H01L 21/28518 257/774 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0072511 A1* | 3/2015 | Liu | H01L 29/66545 438/586 |
| 2015/0214113 A1* | 7/2015 | Bouche | H01L 21/823431 438/283 |
| 2015/0228793 A1* | 8/2015 | Chen | H01L 29/7851 257/401 |
| 2015/0262868 A1 | 9/2015 | Ting et al. | |
| 2015/0364371 A1* | 12/2015 | Yen | H01L 21/823475 257/401 |
| 2015/0371928 A1 | 12/2015 | Chen et al. | |
| 2016/0064327 A1* | 3/2016 | Lin | H01L 27/0629 257/368 |
| 2018/0033866 A1* | 2/2018 | Liao | H01L 21/28123 |
| 2018/0151429 A1* | 5/2018 | Wang | H01L 21/28518 |
| 2018/0174904 A1* | 6/2018 | Hsieh | H01L 21/76897 |
| 2018/0175201 A1* | 6/2018 | Wang | H01L 29/7851 |
| 2018/0197970 A1* | 7/2018 | Pan | H01L 29/665 |

FOREIGN PATENT DOCUMENTS

| | | |
|---|---|---|
| KR | 20150143263 A | 12/2015 |
| TW | 200832682 A | 8/2008 |
| TW | 201104795 A | 2/2011 |
| TW | 201407730 A | 2/2014 |
| TW | 201423907 A | 6/2014 |
| TW | 201428889 A | 7/2014 |
| TW | 201624613 A | 7/2016 |
| TW | 201110438 A | 3/2018 |

* cited by examiner

SELF-ALIGNED SPACERS AND METHOD FORMING SAME

PRIORITY CLAIM AND CROSS-REFERENCE

This application claims the benefit of the following provisionally filed U.S. Patent application: Application Ser. No. 62/427,477, filed Nov. 29, 2016, and entitled "Self-Aligned Spacers and Method Forming Same;" which application is hereby incorporated herein by reference.

BACKGROUND

With the sizes of integrated circuits becoming increasingly smaller, the respective formation processes also become increasingly more difficult, and problems may occur where conventionally no problems have occurred. For example, in the formation of Fin Field-Effect Transistors (FinFETs), the metal gates and the adjacent source and drain regions may be electrically shorted to each other. The contact plugs of metal gates may also be shorted to the contact plugs of the adjacent source and drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
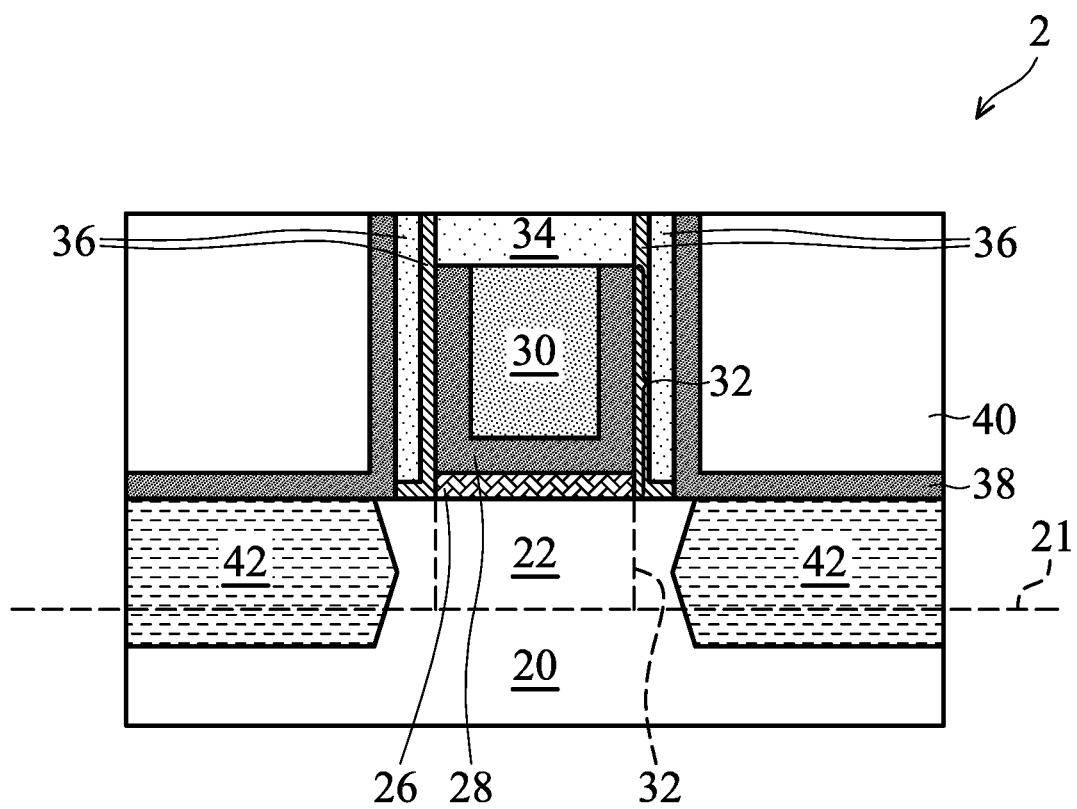
FIGS. 1 through 25 illustrate the cross-sectional views of intermediate stages in the formation of transistor and the overlying interconnect structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor and its overlying interconnect structure and the method of forming the same are provided in accordance with various exemplary embodiments. The intermediate stages of forming the transistor and the overlying interconnect structure are illustrated in accordance with some embodiments. Some variations of some embodiments are discussed. Throughout the various views and illustrative embodiments, like reference numbers are used to designate like elements.

FIGS. 1 through 25 illustrate the cross-sectional views of intermediate stages in the formation of a transistor and the overlying interconnect structure in accordance with some embodiments of the present disclosure. The steps shown in FIGS. 1 through 25 are also reflected schematically in the process flow 200 shown in FIG. 26. The illustrative embodiments use the formation of a Fin Field-Effect Transistor (FinFET) as an example. It is appreciated that the structure and the formation methods of the present disclosure are readily applicable to planar transistors and the respective contact plugs.

Referring to FIG. 1, an initial structure is formed on semiconductor substrate 20, which is a part of semiconductor wafer 2. In accordance with some embodiments of the present disclosure, semiconductor substrate 20 is formed of crystalline silicon. Other commonly used materials such as carbon, germanium, gallium, boron, arsenic, nitrogen, indium, phosphorus, and/or the like, may also be included in semiconductor substrate 20. Substrate 20 may also be a compound semiconductor substrate including a III-V compound semiconductor or silicon germanium.

In accordance with some embodiments of the present disclosure, the initial structure includes a portion of a FinFET formed based on semiconductor fin 22, which protrudes higher than the top surfaces of Shallow Trench Isolation (STI) regions (not shown) on the opposite sides of semiconductor fin 22. Line 21 is drawn to show the level of the top surface of the STI regions, and semiconductor fin 22 is higher than line 21.

Gate stack 32 is formed on semiconductor fin 22, and has portions extending on the top surface and the sidewalls of semiconductor fin 22. In accordance with some embodiments of the present disclosure, gate stack 32 is a replacement gate stack that is formed by forming a dummy gate stack (not shown) and then replacing the dummy gate stack with the replacement gate. Gate stack 32 may include interfacial oxide layer 26 contacting the top surface and the sidewalls of semiconductor fin 22, gate dielectric 28 over interfacial oxide layer 26, and gate electrode 30 over gate dielectric 28. Hard mask 34 is formed over gate electrode 30 to protect gate stack 32 in a plurality of subsequent processes. Hard mask 34 may also be considered as a part of the gate stack. Interfacial oxide layer 26 may be formed by thermal oxidizing a surface layer of semiconductor fin 22. Gate dielectric 28 may be formed of silicon oxide, silicon nitride, a high-k dielectric material(s) such as hafnium oxide, lanthanum oxide, aluminum oxide, combinations thereof, or multi-layers thereof. Gate electrode 30 may be a metal gate including, for example, cobalt, aluminum, titanium nitride, tantalum nitride, tungsten, tungsten nitride, tantalum carbide, tantalum silicon nitride, or the like, and may include multiple layers of different materials. Depending on whether the respective transistor is a P-type Metal-Oxide-Semiconductor (PMOS) transistor or an N-type Metal-Oxide-Semiconductor (NMOS) transistor, the material of gate electrode 30 may be selected to have work functions suitable for the respective MOS transistors.

Gate spacers 36 are formed on the sidewalls of gate stack 32 and hard mask 34. In accordance with some embodiments of the present disclosure, gate spacers 36 include a plurality of layers, for example, the two layers as illustrated. Although not shown, more layers may be included in gate spacers 36. The materials of gate spacers 36 include silicon oxide, silicon nitride, silicon oxynitride, silicon carbo-oxynitride, and/or the like. The layers in each of gate spacers 36 may include elements different from each other, for example, with one formed of silicon oxide, and the other formed of silicon nitride. Alternatively, the illustrated layers in each of gate spacers 36 include same elements (such as silicon and nitrogen) with different compositions (having different percentages). Gate spacers 36 may be in contact with the top surfaces and the sidewalls of semiconductor fin 22 in accordance with some embodiments.

Contact Etch Stop Layer (CESL) 38 is formed to cover substrate 20, and may extend on the sidewalls of gate spacers 36. In accordance with some embodiments of the present disclosure, CESL 38 is formed of silicon nitride, silicon carbide, or another dielectric material. Inter-Layer Dielectric (ILD) 40 is formed over CESL 38 and gate stack 32. ILD 40 is referred to as ILD0 hereinafter since it is the lowest ILD in a plurality of ILDs. ILD0 40 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The formation may include, for example, Chemical Vapor Deposition (CVD), Flowable CVD (FCVD), spin-on coating, or the like. A planarization such as a Chemical Mechanical Polish (CMP) may be performed to level the top surfaces of hard mask layer 34, gate spacers 36, CESL 38, and ILD0 40 to be coplanar with each other.

Source and drain regions (referred to as source/drain regions hereinafter) 42 are formed, with at least lower portions of source/drain regions 42 extending into semiconductor substrate 20. In accordance with some embodiments of the present disclosure, source/drain regions 42 include a p-type or an n-type impurity, depending on whether the respective transistor is a P-type transistor or an n-type transistor. Source/drain regions 42 may include SiP when the respective transistor is an n-type MOS transistor, or SiGe when the respective transistor is a p-type MOS transistor. The formation of source/drain regions 42 may include etching semiconductor fin 22 to form recesses, and epitaxially growing source/drain regions 42 in the recesses. When a p-type transistor is to be formed, epitaxy regions 42 may be doped with a p-type impurity such as boron or indium. When an n-type transistor is to be formed, epitaxy regions 42 may be doped with an n-type impurity such as phosphorous. The p-type or the n-type impurity may be in-situ doped when the epitaxy is performed, and/or implanted after the epitaxy.

Figure 2:
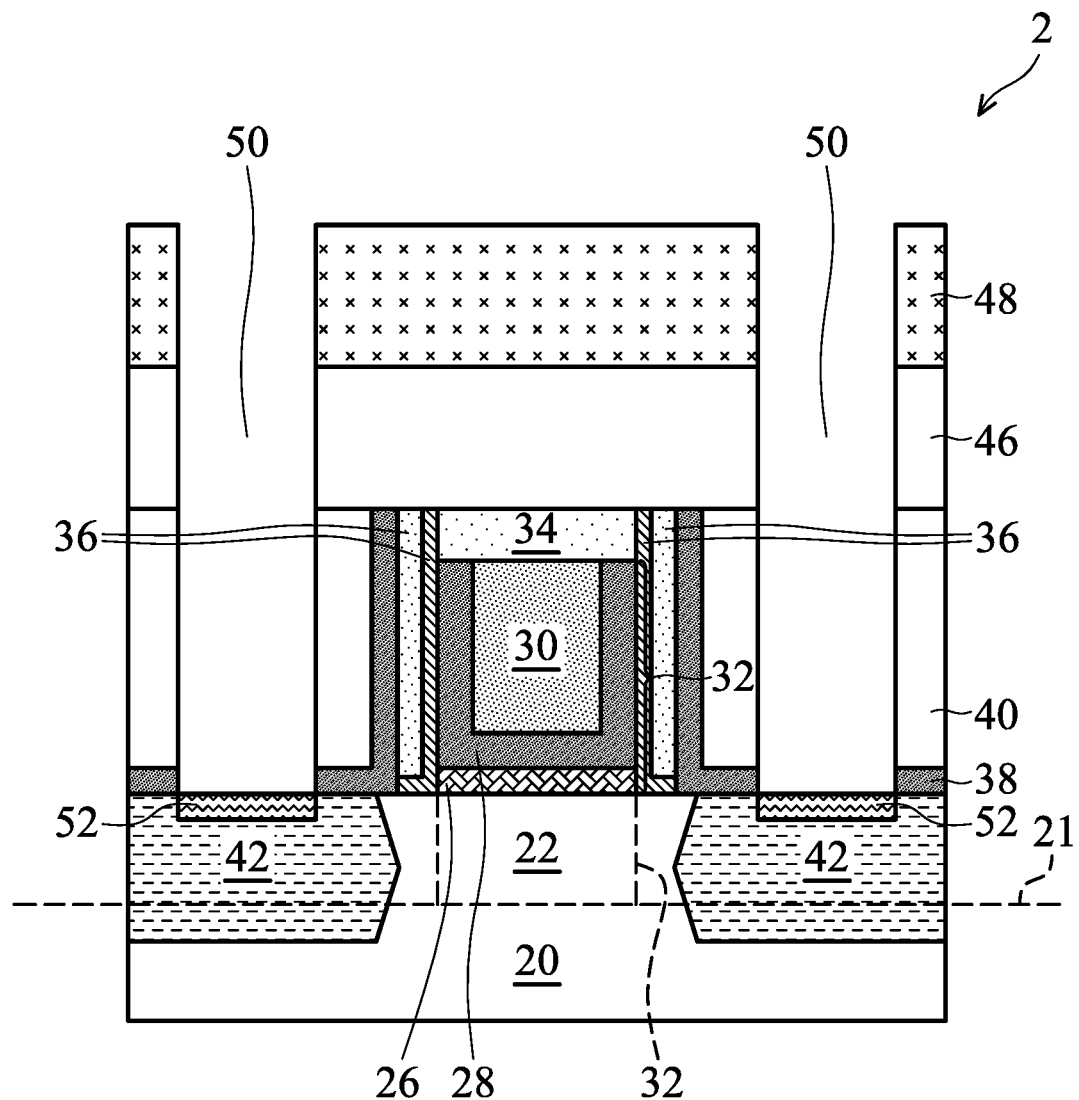

FIGS. 2 through 6 illustrate the formation of lower source/drain contact plugs. In accordance with some embodiments of the present disclosure, as shown in FIG. 2, sacrificial dielectric layer 46 is formed, followed by the application and the patterning of photo resist 48. In accordance with alternative embodiments of the present disclosure, the formation of sacrificial dielectric layer 46 is skipped. The patterned photo resist 48 may be a single-layer photo resist, or may be a tri-layer including two photo resists and an inorganic layer separating the two photo resists. Next, sacrificial dielectric layer 46, ILD0 40, and CESL 38 are etched to form contact openings 50. Source/drain silicide regions 52 are then formed, for example, through a self-aligned silicidation process. Photo resist 48 is then removed.

It is appreciated that source/drain contact openings 50 may be formed in a single lithography process, or may be formed in a double patterning process including two lithography processes, wherein the pattern of the source/drain contact opening 50 on the left side of replacement gate stack 32 is in a first lithography mask (not shown), and the pattern of the source/drain contact opening 50 on the right side of replacement gate stack 32 is in a second lithography mask (not shown).

Figure 3:
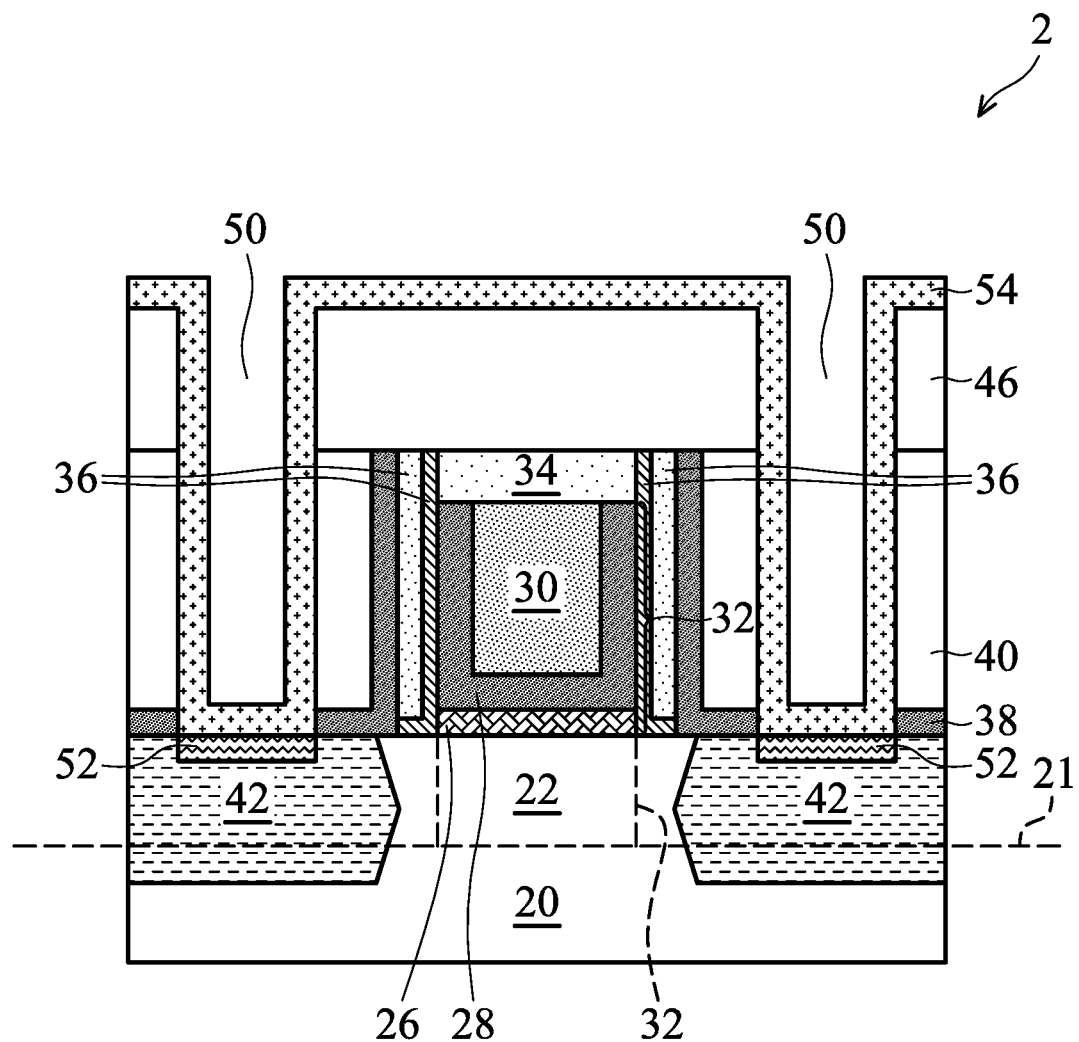

Referring to FIG. 3, dielectric spacer layer 54 is deposited. Dielectric spacer layer 54 may be formed of a dielectric material such as SiN, SiCN, SiC, AlON, $HfO_x$, etc. Dielectric spacer layer 54 is formed using a conformal deposition method such as Atomic Layer Deposition (ALD), Chemical Vapor Deposition (CVD), or the like. Accordingly, dielectric spacer layer 54 extends into openings 50, and the thickness of the vertical portions of dielectric spacer layer 54 is substantially equal to the thickness of the horizontal portions.

Figure 4:
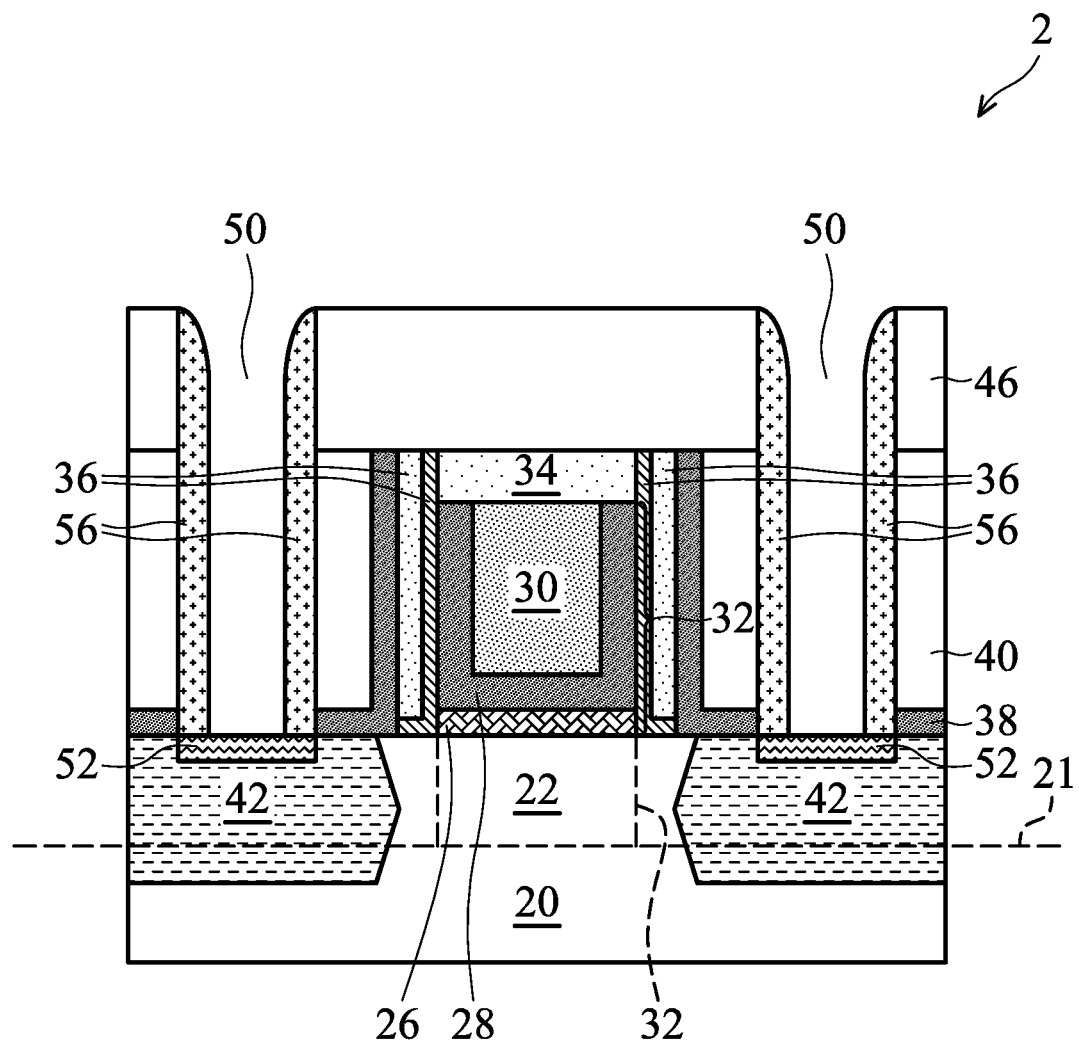

Referring to FIG. 4, an anisotropic etch is performed to remove the horizontal portions of dielectric spacer layer 54, leaving the vertical portions of dielectric spacer layer 54 in contact openings 50. The remaining vertical portions are referred to as contact spacers 56 throughout the description. The respective step is represented by step 202 in the process flow shown in FIG. 26. In the top view of wafer 2, contact spacers 56 form rings encircling the respective contact openings 50. The top portions of the inner edges of contact spacers may be tapered, and may also be curved, with the curved inner edges facing openings 50. The lower portions of the inner edges may be substantially straight.

Figure 5:
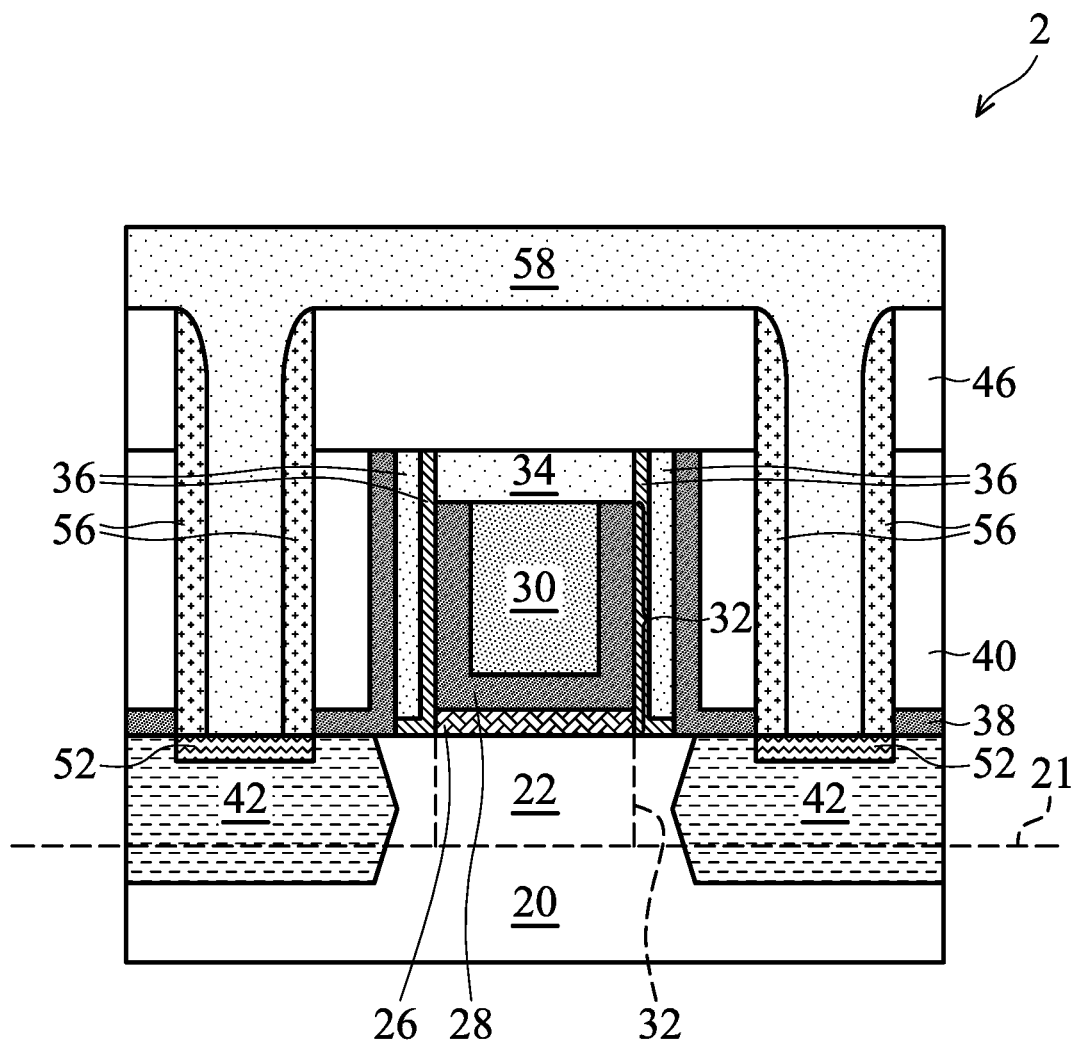
Figure 6:
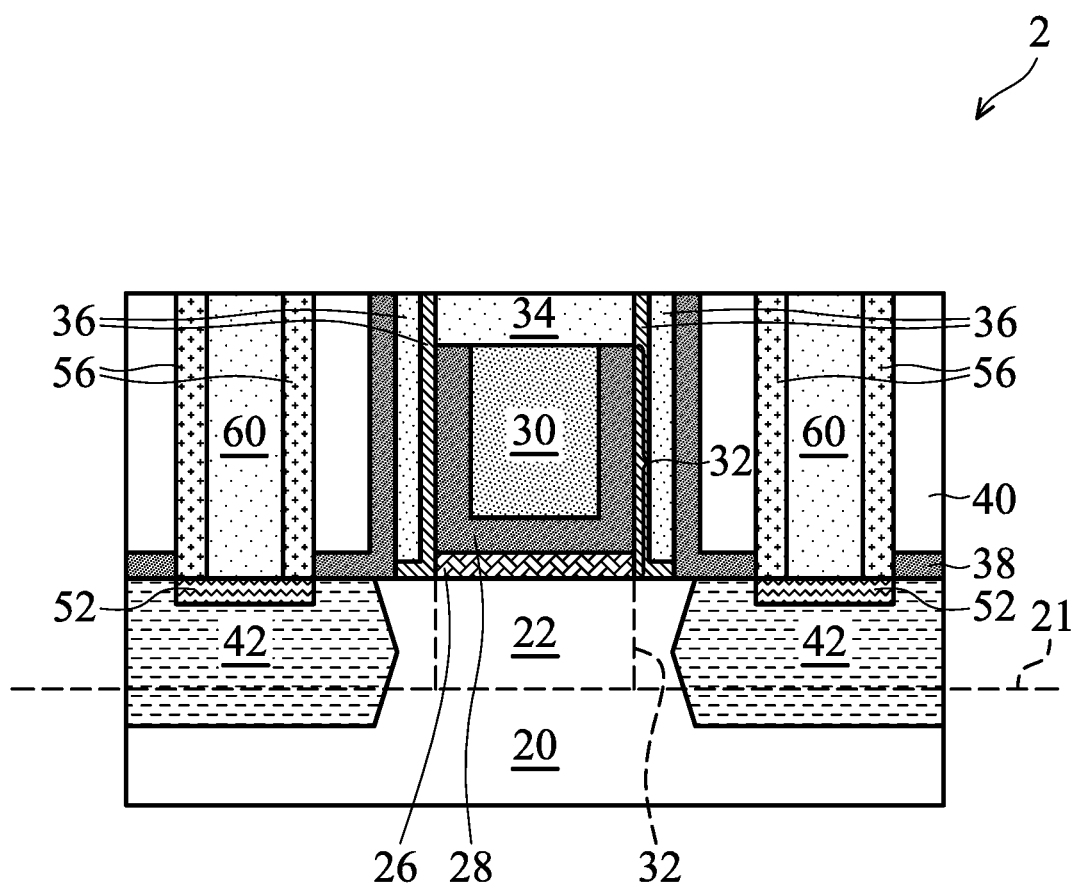

Next, contact openings 50 are filled with a conductive material(s) 58, as shown in FIG. 5. The top surface of conductive material is higher than the top surface of sacrificial dielectric layer 46. FIG. 6 illustrates a planarization process, wherein the portions of conductive material(s) 58 over ILD0 40 are removed. Sacrificial dielectric layer 46, if formed, is also removed in the planarization. The remaining portions of conductive material(s) 58 are source/drain contact plugs 60. The respective step is represented by step 204 in the process flow shown in FIG. 26. In accordance with some embodiments of the present disclosure, each of source/drain contact plugs 60 includes a conductive barrier layer formed of titanium, titanium nitride, tantalum, or tantalum nitride, and a metal such as tungsten, aluminum, copper, or the like over the diffusion barrier layer. In accordance with alternative embodiments of the present disclosure, contact plugs 60 are formed of a single layer formed of a homogenous material such as tungsten or an alloy. The top surfaces of contact plugs 60 may be coplanar with the top surfaces of ILD0 40 and hard mask 34 in accordance with some embodiments.

Figure 7:
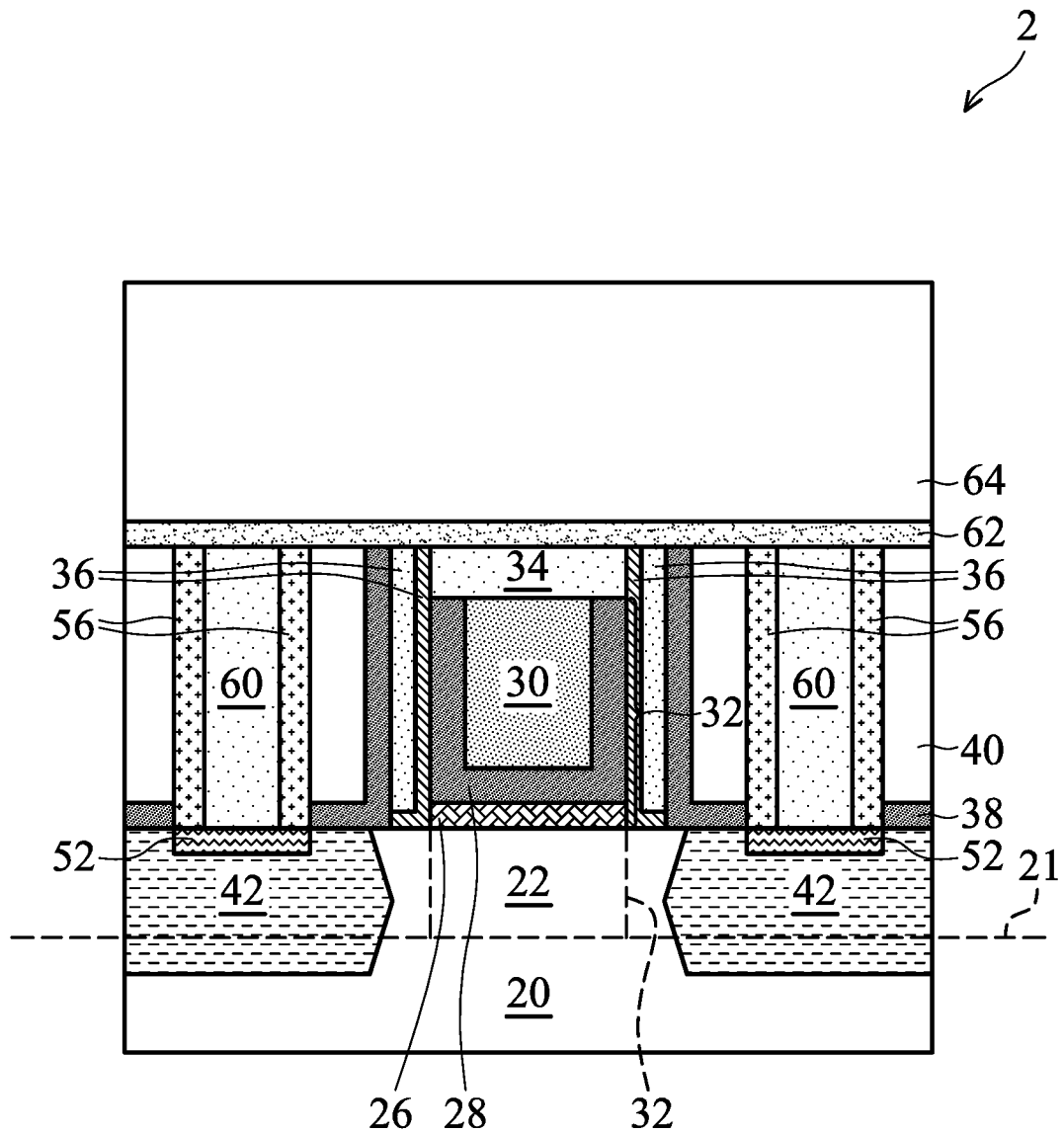

FIGS. 7 through 12 illustrate the formation of upper source/drain contact plugs. Referring to FIG. 7, etch stop layer 62 is formed, followed by the formation of ILD 64. Throughout the description, ILD 64 is alternately referred to as ILD1. Etch stop layer 62 may be formed of silicon carbide, silicon oxynitride, silicon carbo-nitride, combinations thereof, or composite layers thereof. Etch stop layer 62 may be formed using a deposition method such as CVD, Plasma Enhanced Chemical Vapor Deposition (PECVD), ALD, or the like. ILD1 64 may include a material selected from PSG, BSG, BPSG, Fluorine-doped Silicon Glass (FSG), TEOS, or other non-porous low-k dielectric materials. ILD1 64 may be formed using spin coating, FCVD, or the like, or formed using a deposition method such as CVD, PECVD, Low Pressure Chemical Vapor Deposition (LP-CVD), or the like.

Figure 8:
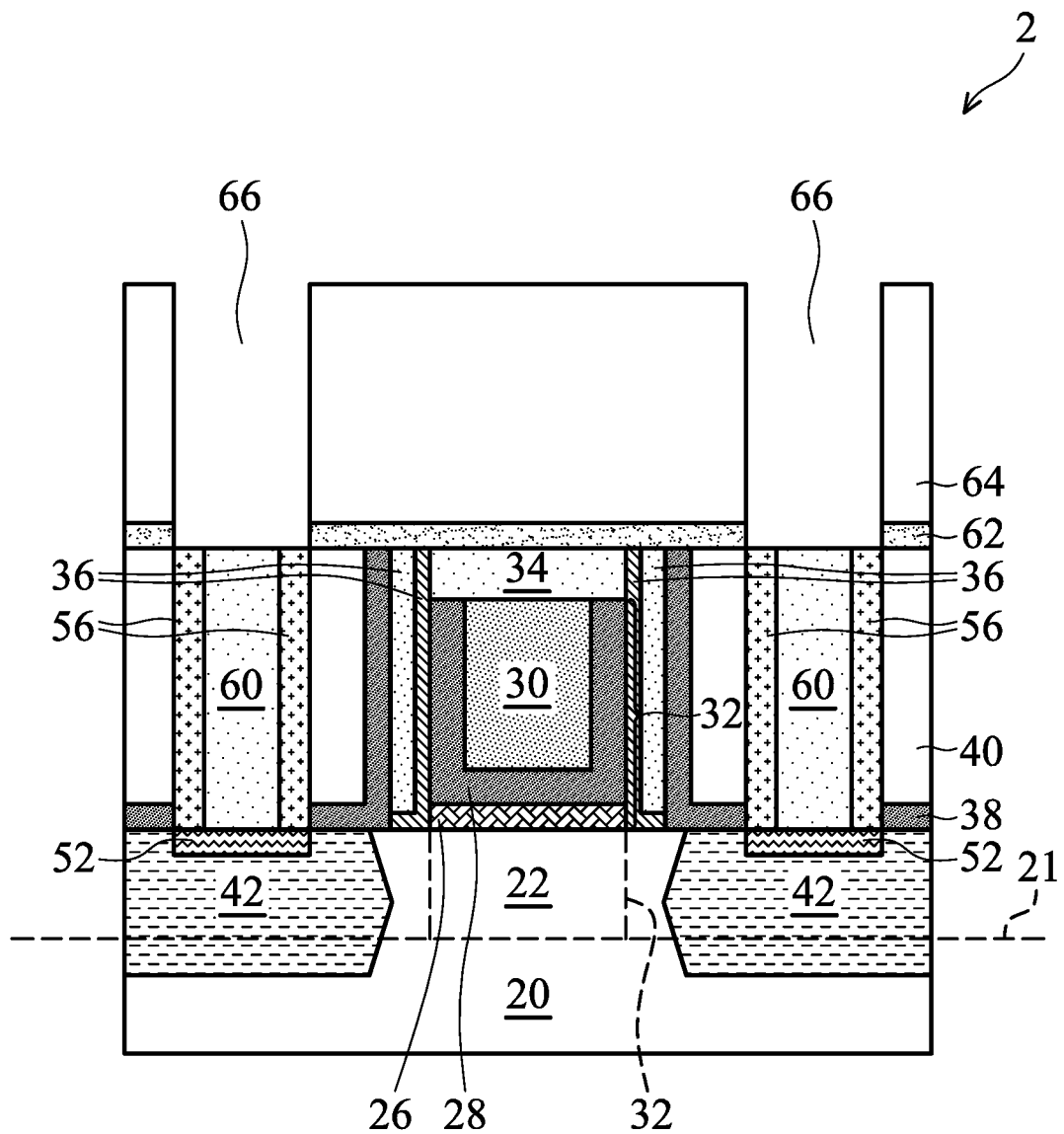

FIG. 8 illustrates the formation of openings 66, which is formed through etching. Next, referring to FIG. 9, dielectric spacer layer 68 is formed through deposition, and is formed as a conformal or substantially conformal layer, for example, with the thicknesses of horizontal portions and vertical portions having a difference smaller than about 10 percent of the horizontal thickness. The deposition may be achieved through ALD, CVD, or the like. Dielectric spacer layer 68 may be formed of a dielectric material selected from SiN, SiON, SiCN, SiC, SiOCN, AlON, AlN, $HfO_x$, combinations thereof, and/or multi-layers thereof.

Figure 9:
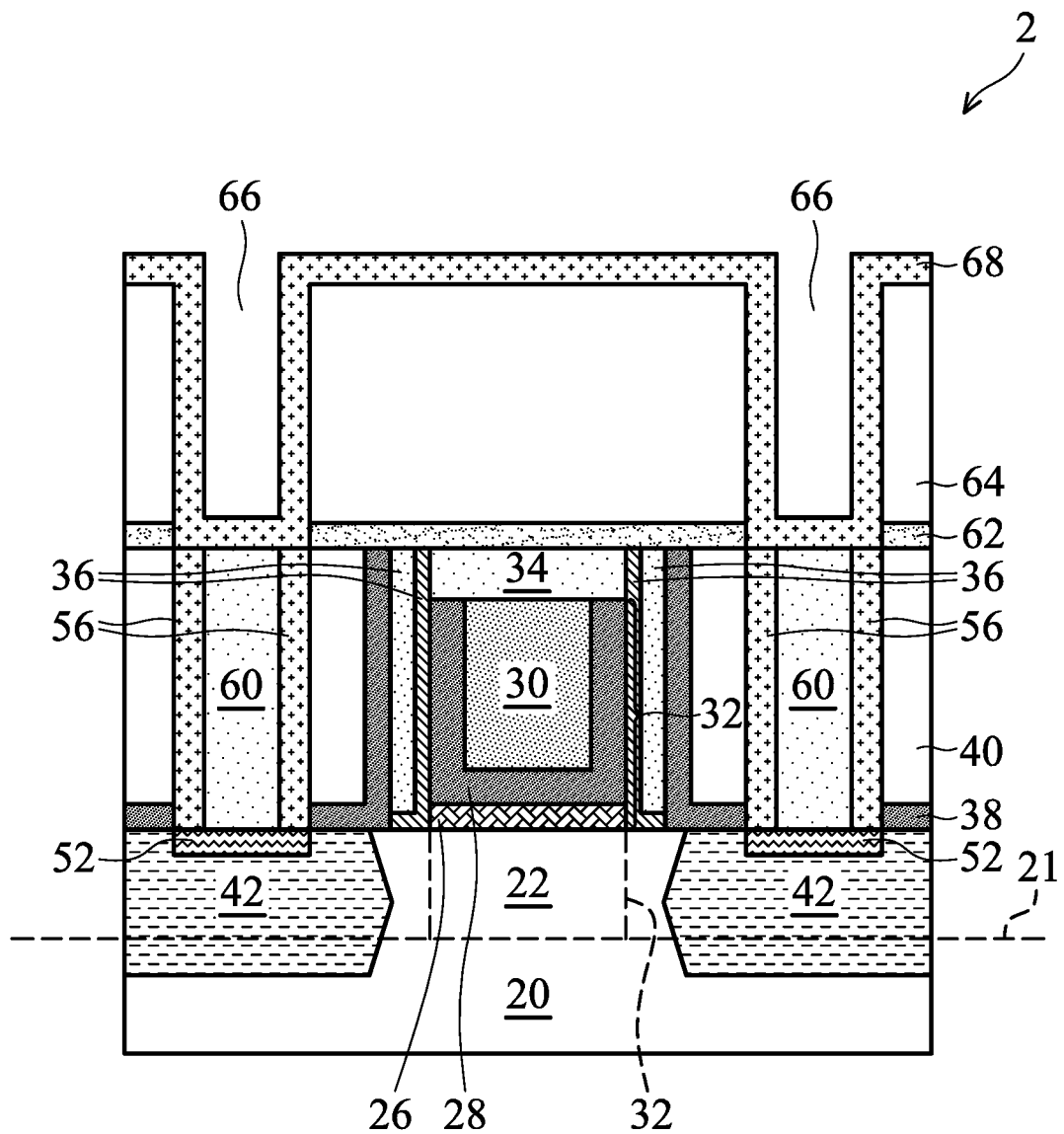
Figure 10:
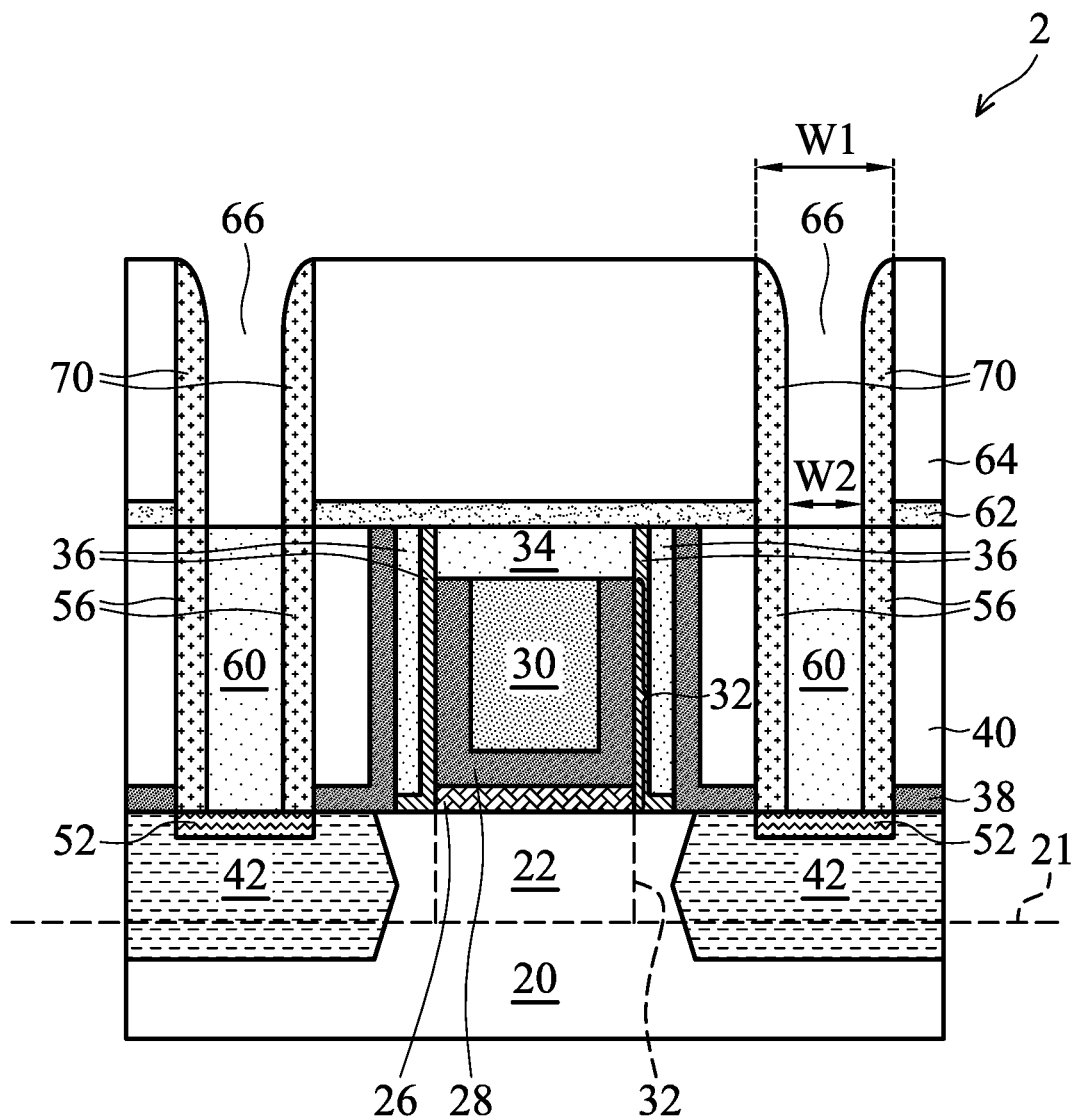

FIG. 10 illustrates the anisotropic etch to remove the horizontal portions of dielectric spacer layer 68, hence forming contact spacers 70 as shown in FIG. 10. The respective step is represented by step 206 in the process flow shown in FIG. 26. Due to the anisotropic etching of dielectric spacer layer 68 (FIG. 9), the remaining openings 66 may have top width W1 and bottom width W2, wherein ratio W1/W2 may be in the range between about 1.0 and about 2.0. The top portions of the inner edges of contact spacers 70 may be tapered, and may also be curved, with the curved portions facing openings 66. The lower portions of contact spacers 70 may have substantially straight edges facing openings 66. Again, in the top view of wafer 2, contact spacers 70 are rings that encircle the respective openings 66.

Figure 11:
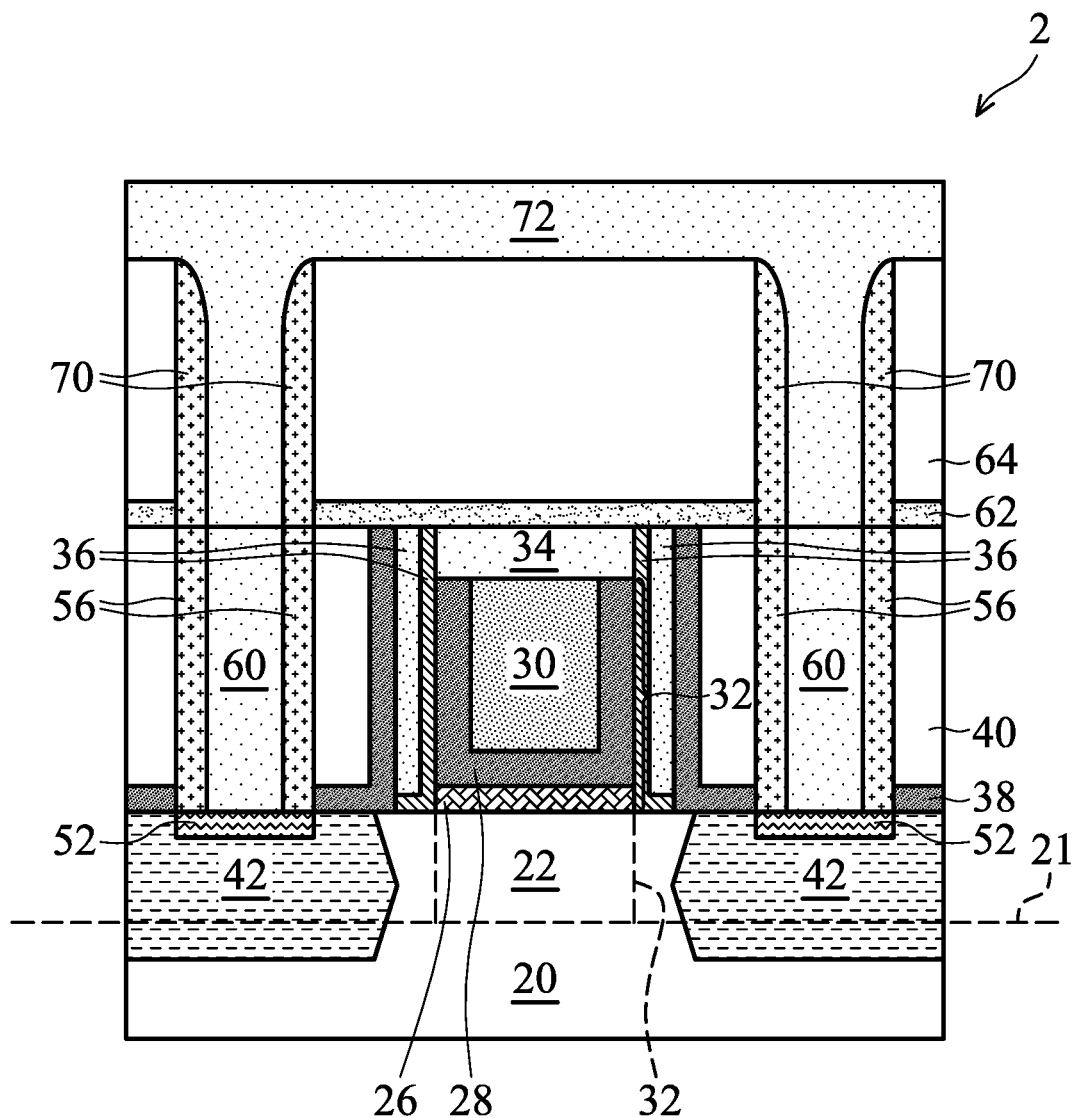
Figure 12:
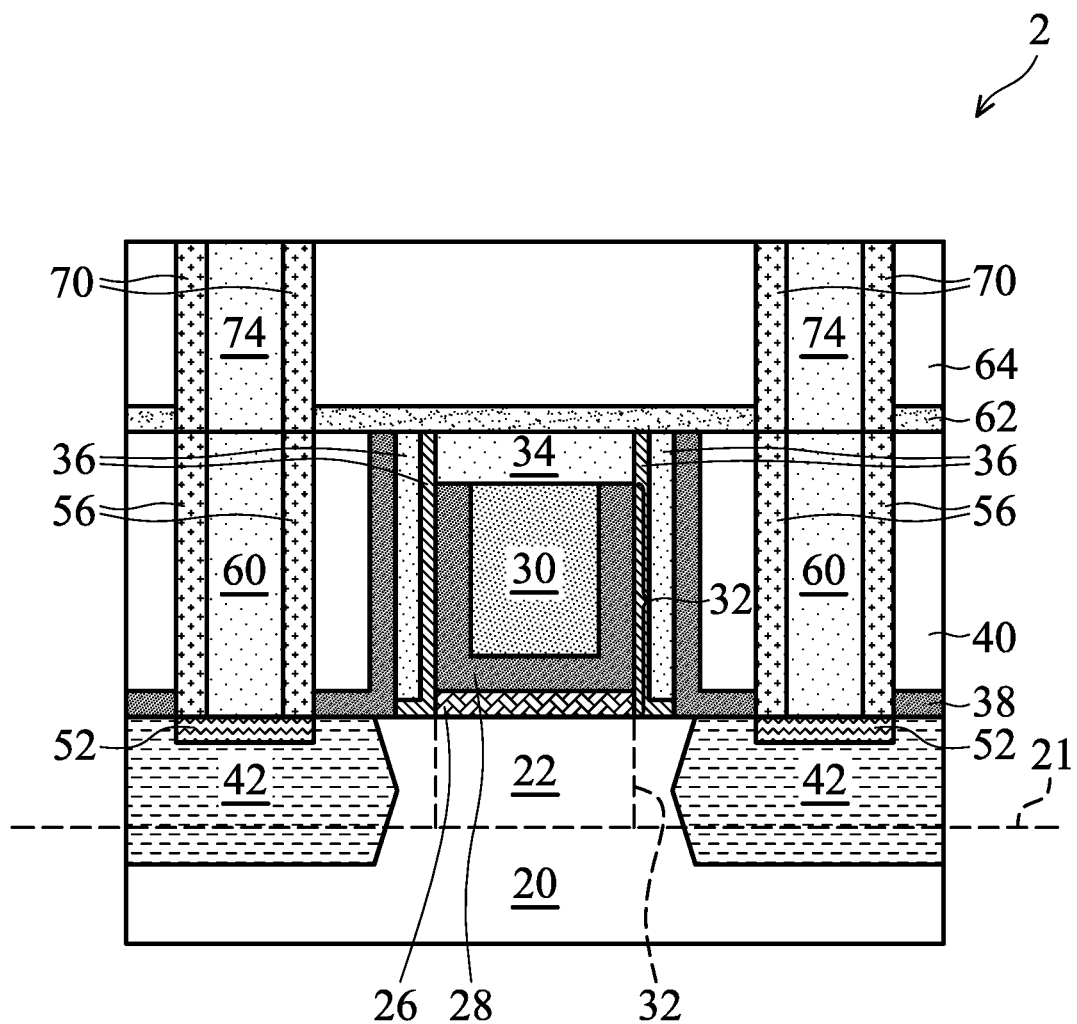

Next, contact openings 66 are filled with a conductive material(s) 72, as shown in FIG. 11. A planarization process (for example, a CMP) is then performed, wherein the portions of conductive material(s) 72 over ILD1 64 are removed. The remaining portions of conductive material(s) 72 remain after the planarization, and are referred to as upper source/drain contact plugs 74, as shown in FIG. 12. In accordance with some embodiments of the present disclosure, the tapered top portions of contact spacers 70 are removed in the planarization, and the remaining contact spacers 70 have substantially straight inner edges contacting contact plugs 74. The respective step is represented by step 208 in the process flow shown in FIG. 26.

In accordance with alternative embodiments of the present disclosure, the tapered top portions of contact spacers 70 have portions remaining (not shown) after the planarization, and the inner edges of remaining contact spacers 70 have curved top portions (as shown in FIG. 11) in physical contact with contact plugs 74. In accordance with some embodiments of the present disclosure, the material of upper source/drain contact plugs 74 is similar to that of source/drain contact plugs 60. For example, source/drain contact plugs 74 may include conductive barrier layers, and a metal such as tungsten, aluminum, copper, or the like over the diffusion barrier layers.

Figure 13:
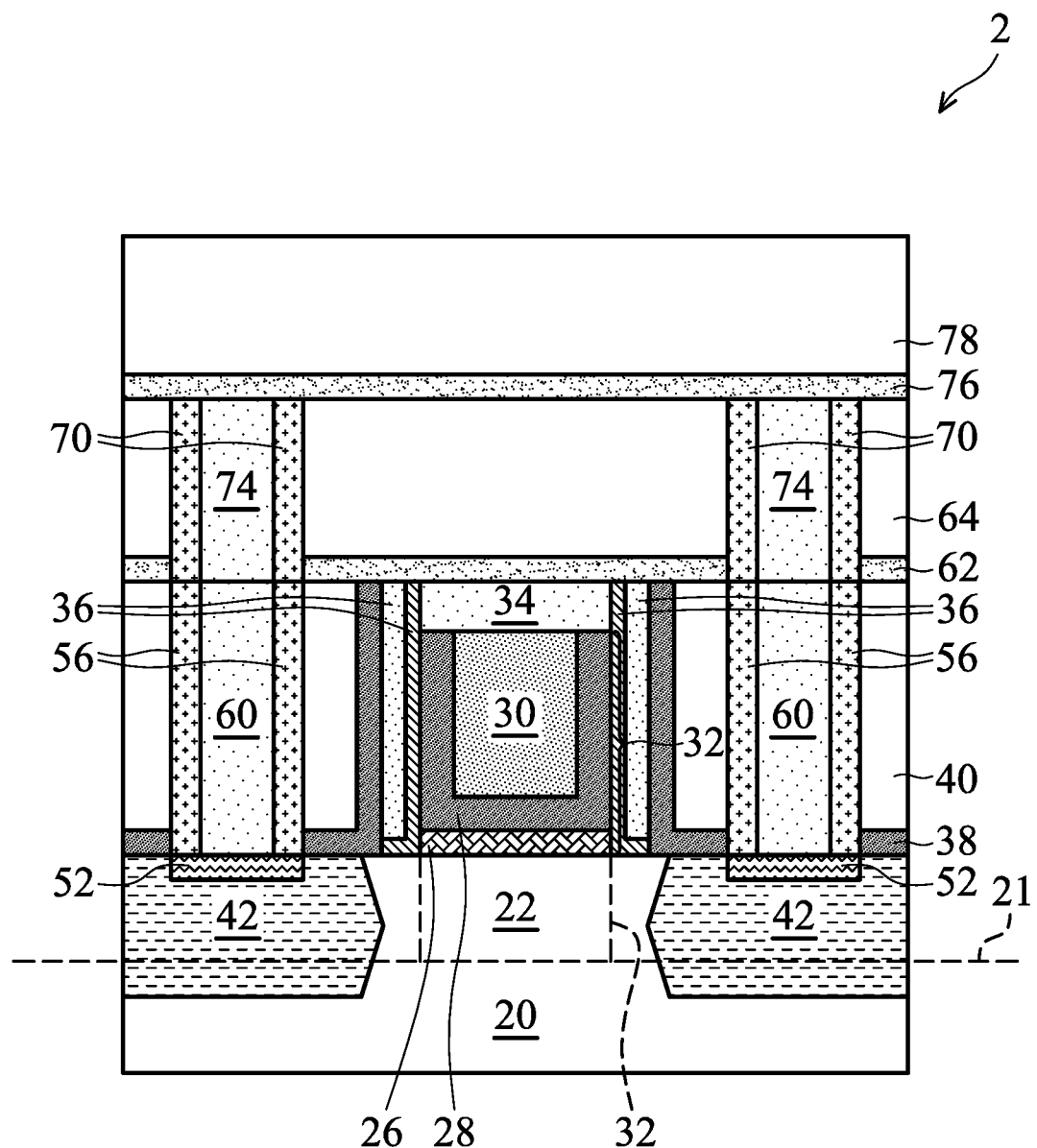

FIGS. 13 through 20 illustrate the formation of a gate contact plug and additional source/drain contact plugs. In accordance with some embodiments of the present disclosure, as shown in FIG. 13, etch stop layer 76 is formed in accordance with some embodiments of the present disclosure, followed by the formation of dielectric layer 78, which may be referred to as ILD2 78 throughout the description. In accordance with alternative embodiments of the present disclosure, etch stop layer 76 is not formed, and dielectric layer 78 is in contact with ILD1 64. Accordingly, etch stop layer 76 is illustrated using dashed lines to indicate it may or may not be formed. In accordance with some embodiments of the present disclosure, etch stop layer 76 and dielectric layer 78 are formed of the materials selected from the same groups of candidate materials of etch stop layer 62 and dielectric layer 64, respectively. In accordance with alternative embodiments of the present disclosure, dielectric layer 78 is formed of a low-k dielectric material, which may be formed of a carbon-containing low-k dielectric material, Hydrogen SilsesQuioxane (HSQ), MethylSilsesQuioxane (MSQ), or the like.

Figure 14:
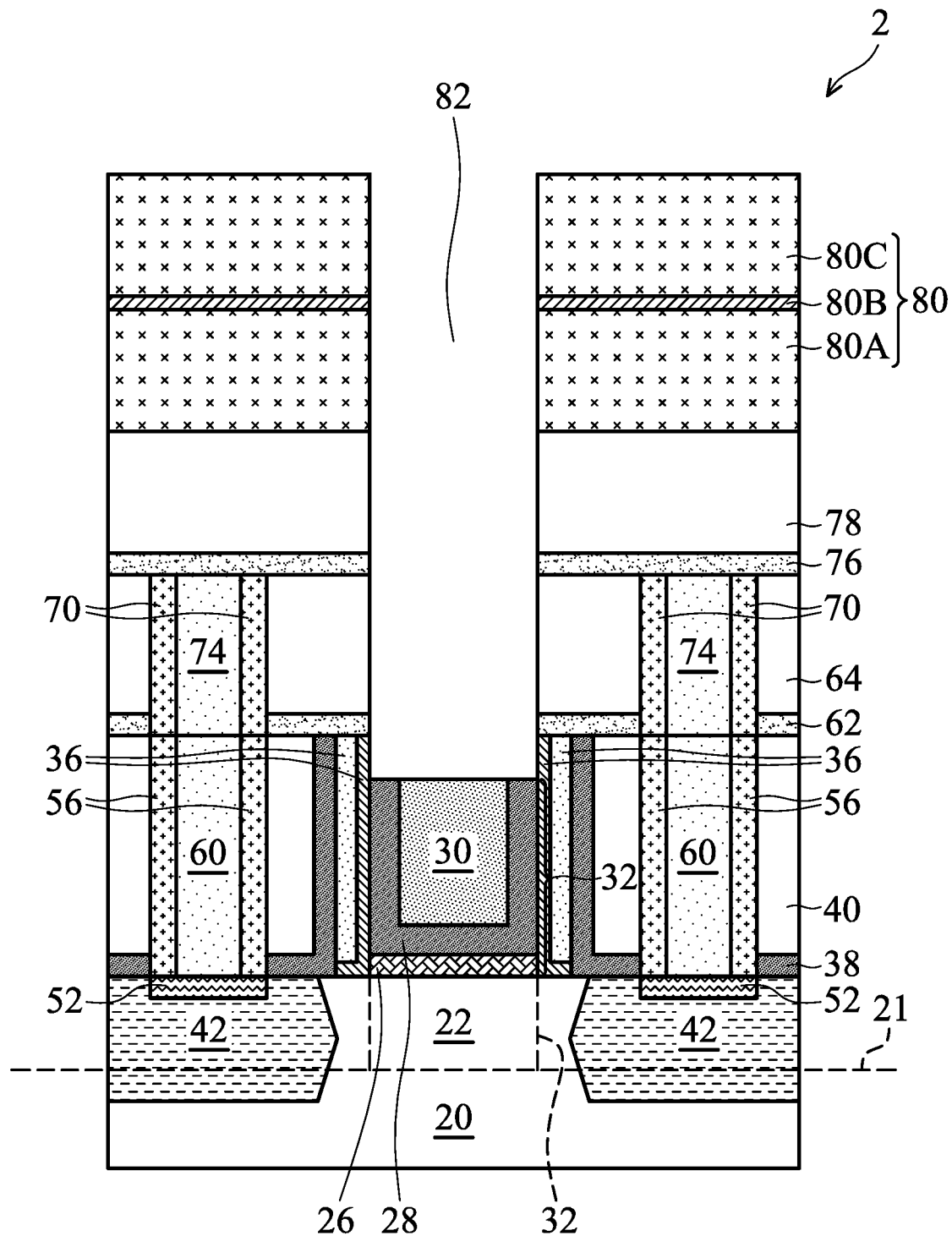

Referring to FIG. 14, a photo lithography process is performed using patterned lithography mask 80 to etch-through layers 78, 76, 64, and 62 to form gate contact opening 82. Lithography mask 80 may include under layer 80A formed of photo resist, middle layer 80B formed of an inorganic material, and upper layer 80C formed of another photo resist. The exposed portion of hard mask 34 (FIG. 13) is then removed, so that gate contact opening 82 extends into the space between opposite gate spacers 36. The respective step is represented by step 210 in the process flow shown in FIG. 26. In accordance with some embodiments of the present disclosure, the formation of gate contact opening 82 includes an anisotropic etching. The sidewalls of gate spacers 36 may be exposed to gate contact opening 82. The etchant may be selected so that it doesn't attack gate spacers 36, and hence the exposed gate spacers 36 are not etched. In accordance with alternative embodiments of the present disclosure, gate contact opening 82 is narrower than hard mask 34, and hence some edge portions of hard mask 34 (not shown) are left on one side or both sides of gate contact opening 82. Although FIG. 14 illustrates middle layer 80B and upper layer 80C, in reality, at the time gate contact opening 82 is formed, middle layer 80B and upper layer 80C may have already been consumed. The remaining lithography mask 80 is then removed, and the resulting wafer 2 is shown in FIG. 15.

Figure 15:
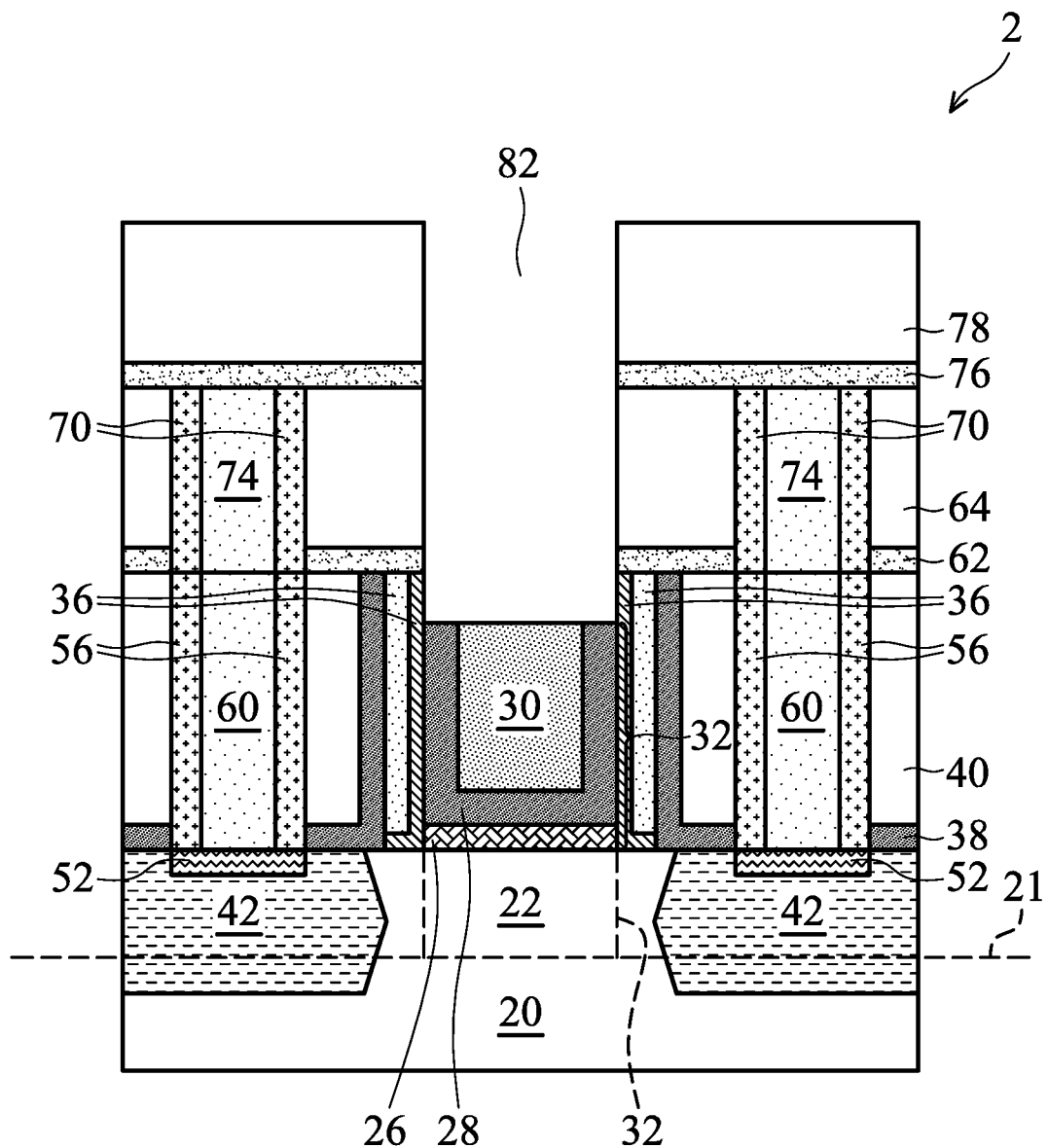
Figure 16:
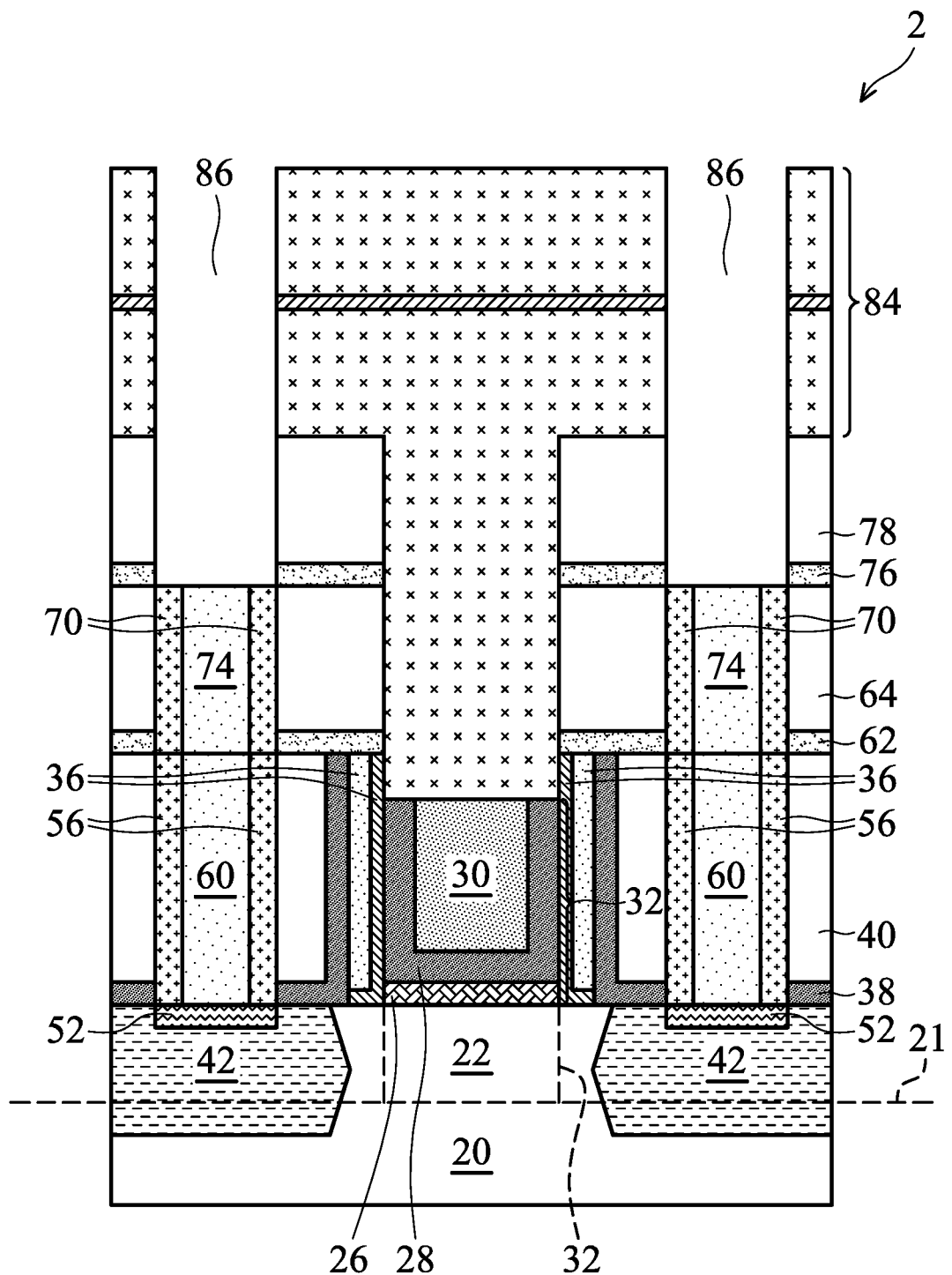
Figure 17:
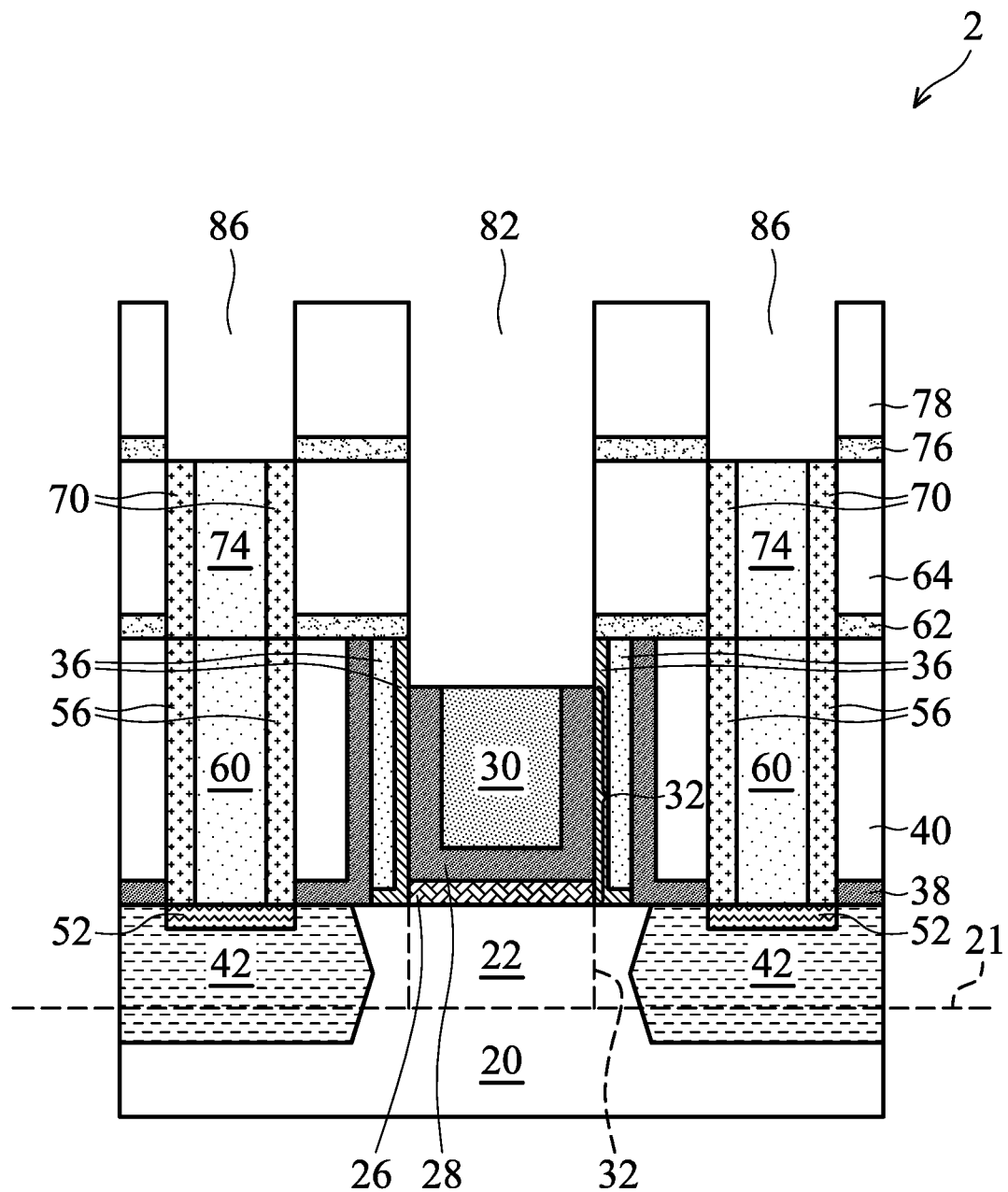

Referring to FIG. 16, another patterned lithography mask 84 is formed, which extends into gate contact opening 82 (FIG. 15). The respective step is represented by step 212 in the process flow shown in FIG. 26. The patterned lithography mask 84 is used as an etching mask to further etch layers 78 and 76, hence forming source/drain contact openings 86. Contact plugs 74 and contact spacers 70 are exposed through contact openings 86. Similarly, by the time contact openings 86 are formed, the middle layer and the upper layer of lithography mask 84 may have been consumed already. Next, the remaining lithography mask 84 is removed, and the resulting wafer 2 is shown in FIG. 17.

Figure 18:
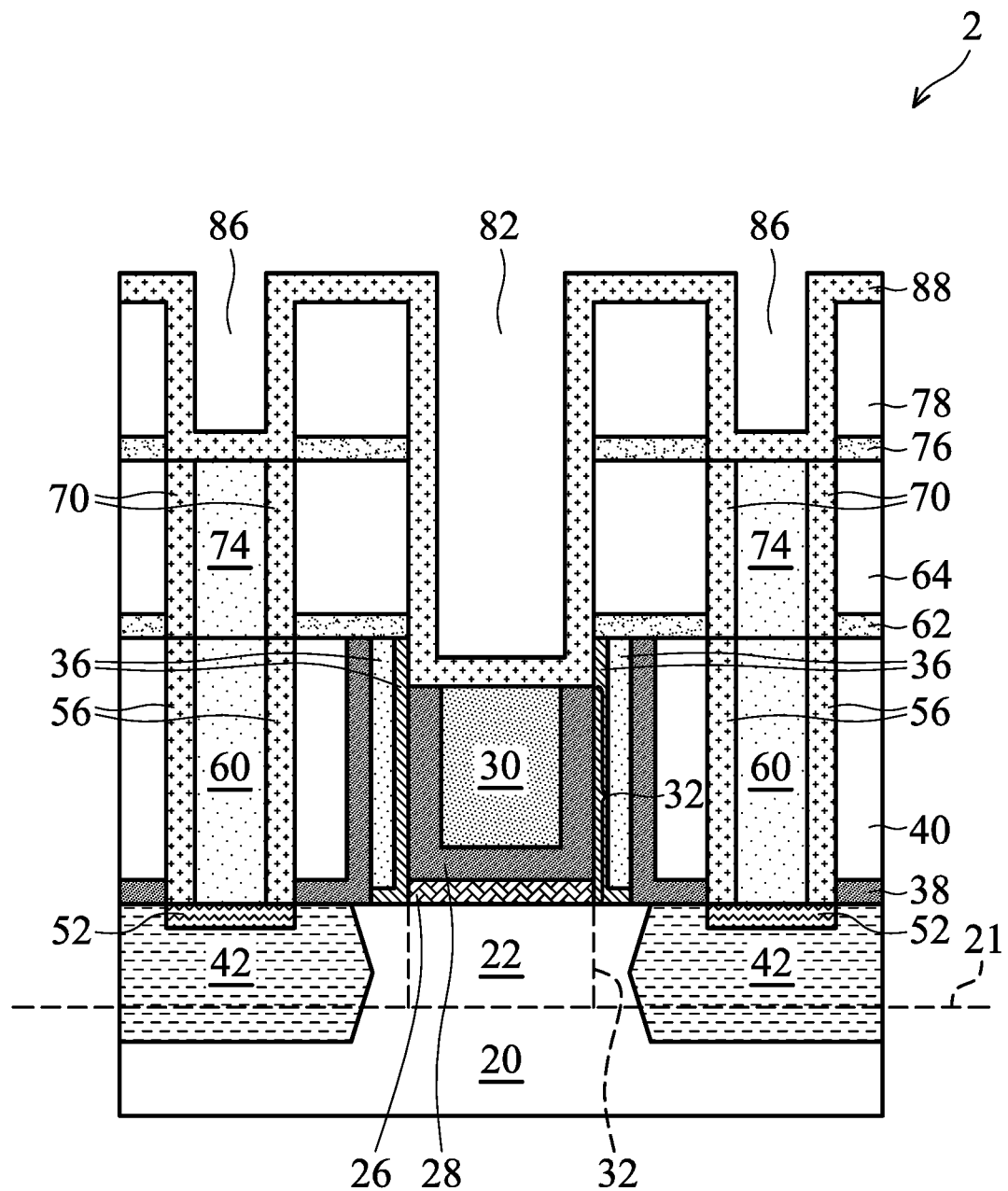

FIG. 18 illustrates the formation of dielectric spacer layer 88, which extends into gate contact opening 82 and source/drain contact openings 86. The formation methods and the materials of dielectric spacer layer 88 may be selected from the same groups of candidate methods and materials, respectively, for forming dielectric spacer layer 68 (FIG. 9). For example, the candidate materials for forming dielectric spacer layer 88 include, and are not limited to, SiN, SiON, SiCN, SiC, SiOCN, AlON, AlN, and $HfO_x$. Dielectric spacer layer 88 is also conformal or substantially conformal. Furthermore, dielectric spacer layer 88 extends into both gate contact opening 82 and source/drain contact openings 86.

Figure 19:
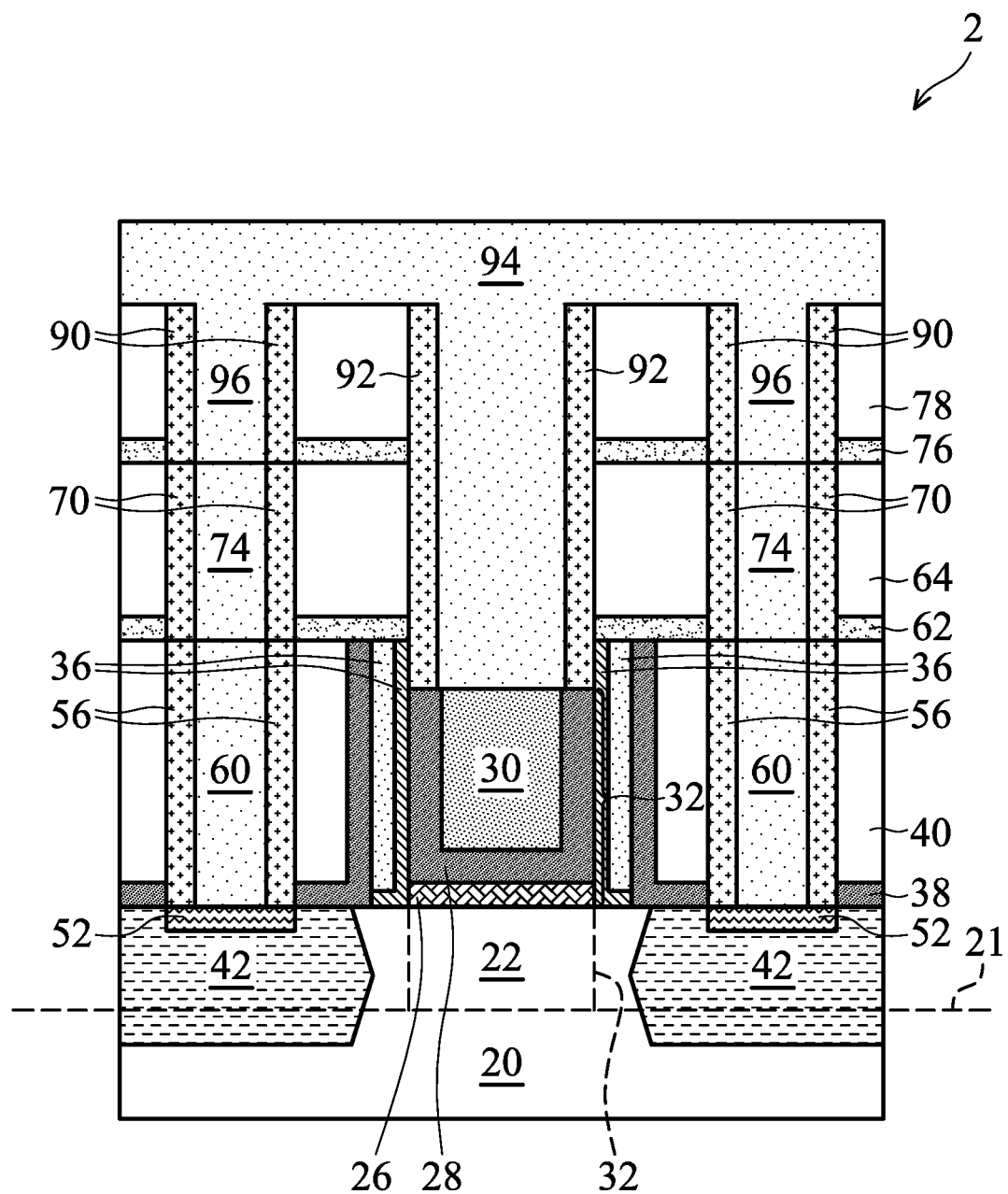
Figure 20:
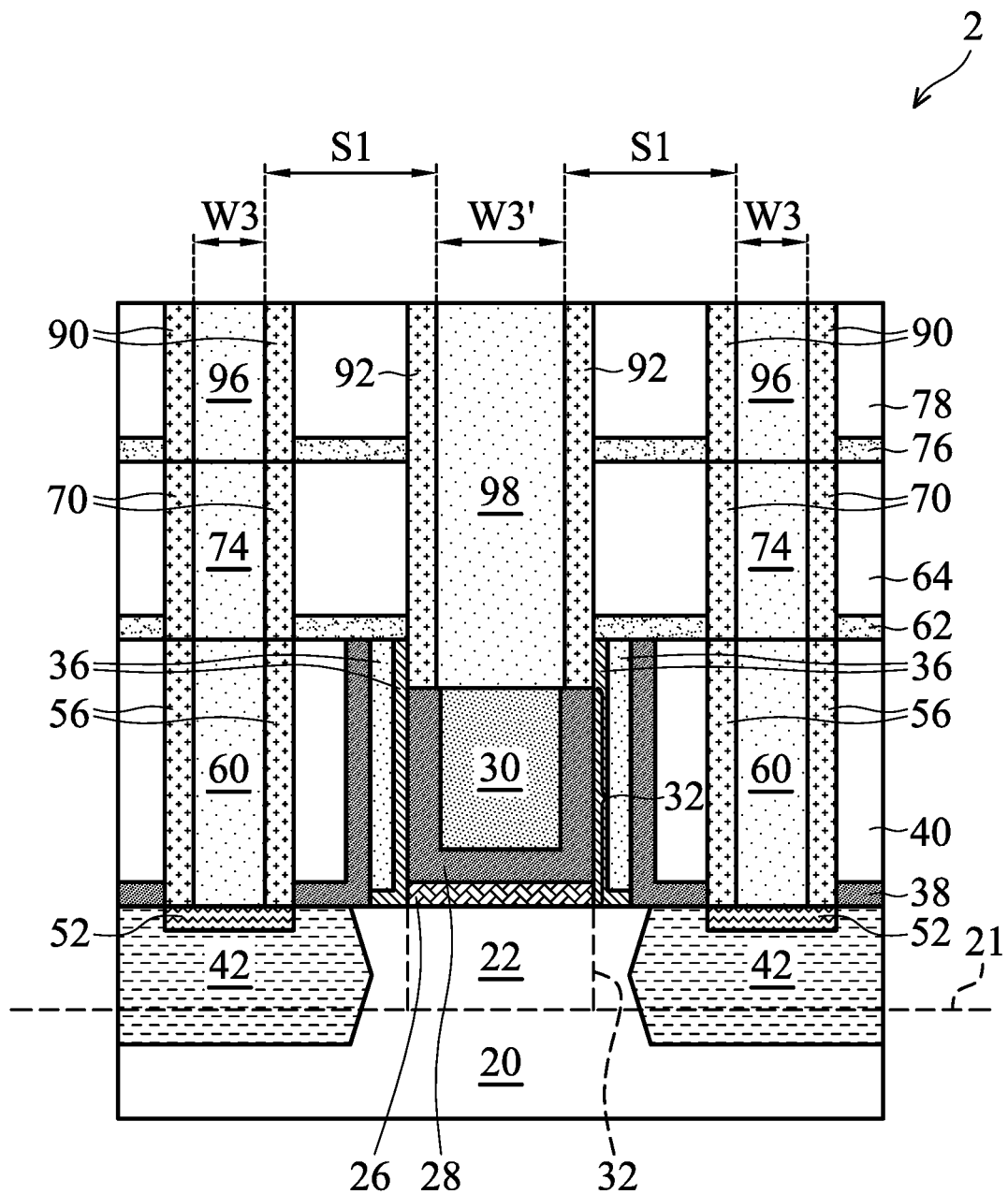

Next, an anisotropic etching is performed, and the remaining portions of dielectric spacer layer 88 form contact spacers 90 and 92, as shown in FIG. 19. The respective step is represented by step 214 in the process flow shown in FIG. 26. Next, conductive material 94 is deposited to fill the remaining contact openings 82 and 86 (FIG. 18). A planarization process is then performed, and the remaining conductive material 94 forms source/drain contact plugs 96 and gate contact plug 98, as shown in FIG. 20. The respective step is represented by step 216 in the process flow shown in FIG. 26. As shown in FIGS. 15 through 19, the formation of contact plugs 96 and 98 includes forming the respective contact openings 82 and 86 (FIG. 17) using double patterning process, and hence contact openings 82 and 86 can be closely located from each other without incurring optical proximity effect. On the other hand, contact openings 82 and 86 are filled simultaneously to reduce production cost.

FIG. 20 also illustrates the widths of contact plugs 96 and 98 and the distances (spacing) between neighboring contact plugs 96 and 98. Contact plugs 96 have width W3, and contact plug 98 has width W3'. The distance between neighboring contact plugs 96 and 98 are S1. In accordance with some embodiments of the present disclosure, ratio S1/W3 and ratio S1/W3' are in the range between about 1.0 to and 2.0.

Figure 21:
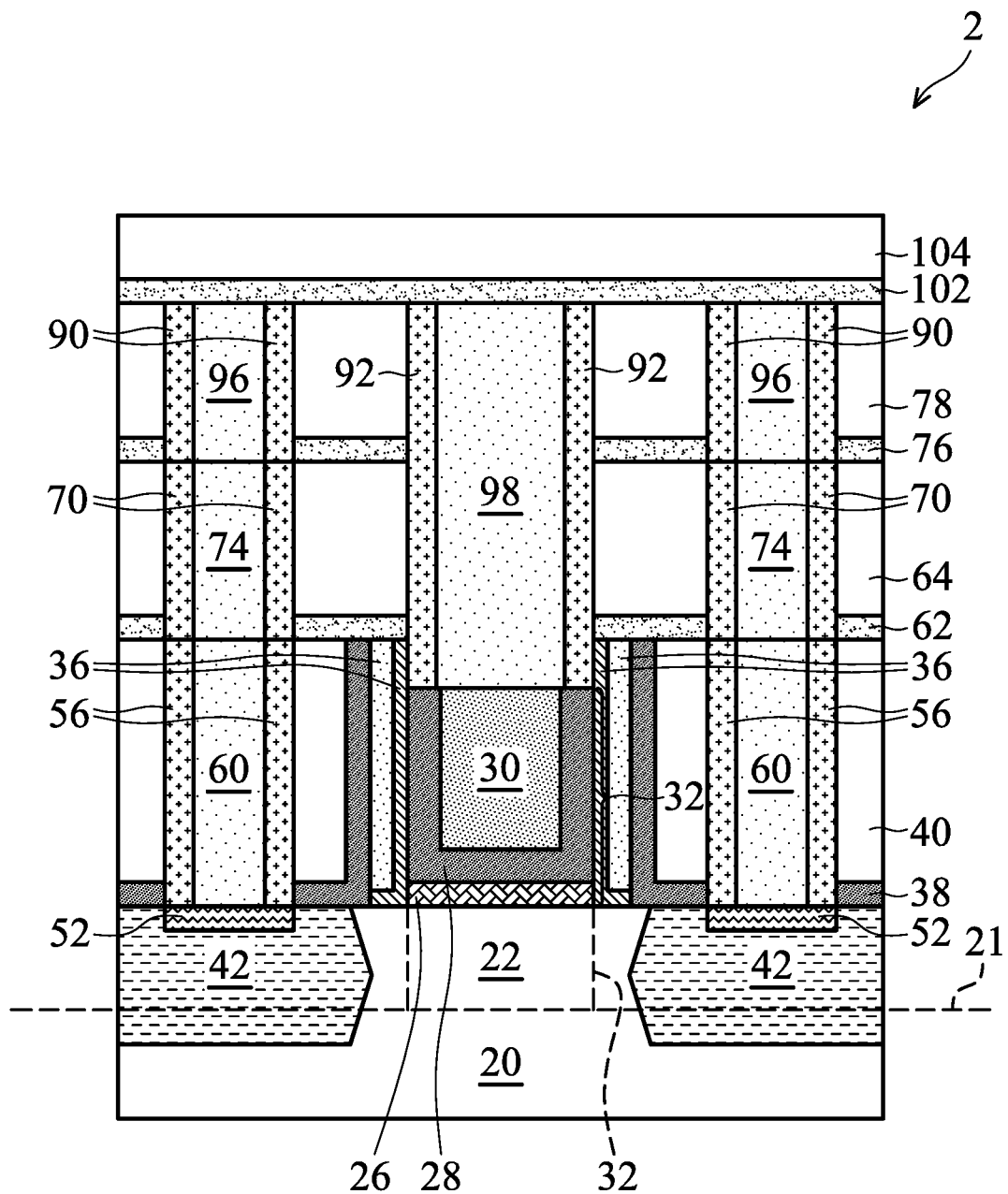

FIGS. 21 through 25 illustrate the formation of a bottom metal layer (referred to as metal layer 1 or M1 hereinafter) and the overlying vias through single damascene processes. Referring to FIG. 21, etch stop layer 102 and dielectric layer 104 are formed. In accordance with some embodiments of the present disclosure, etch stop layer 102 is formed of a material selected from the same group of candidate materials of etch stop layer 76, and dielectric layer 104 may be formed of a low-k dielectric material having a dielectric constant lower than 3.8. For example, low-k dielectric layer 104 may be formed of a carbon-containing low-k dielectric material, HSQ, MSQ, or the like.

Figure 22:
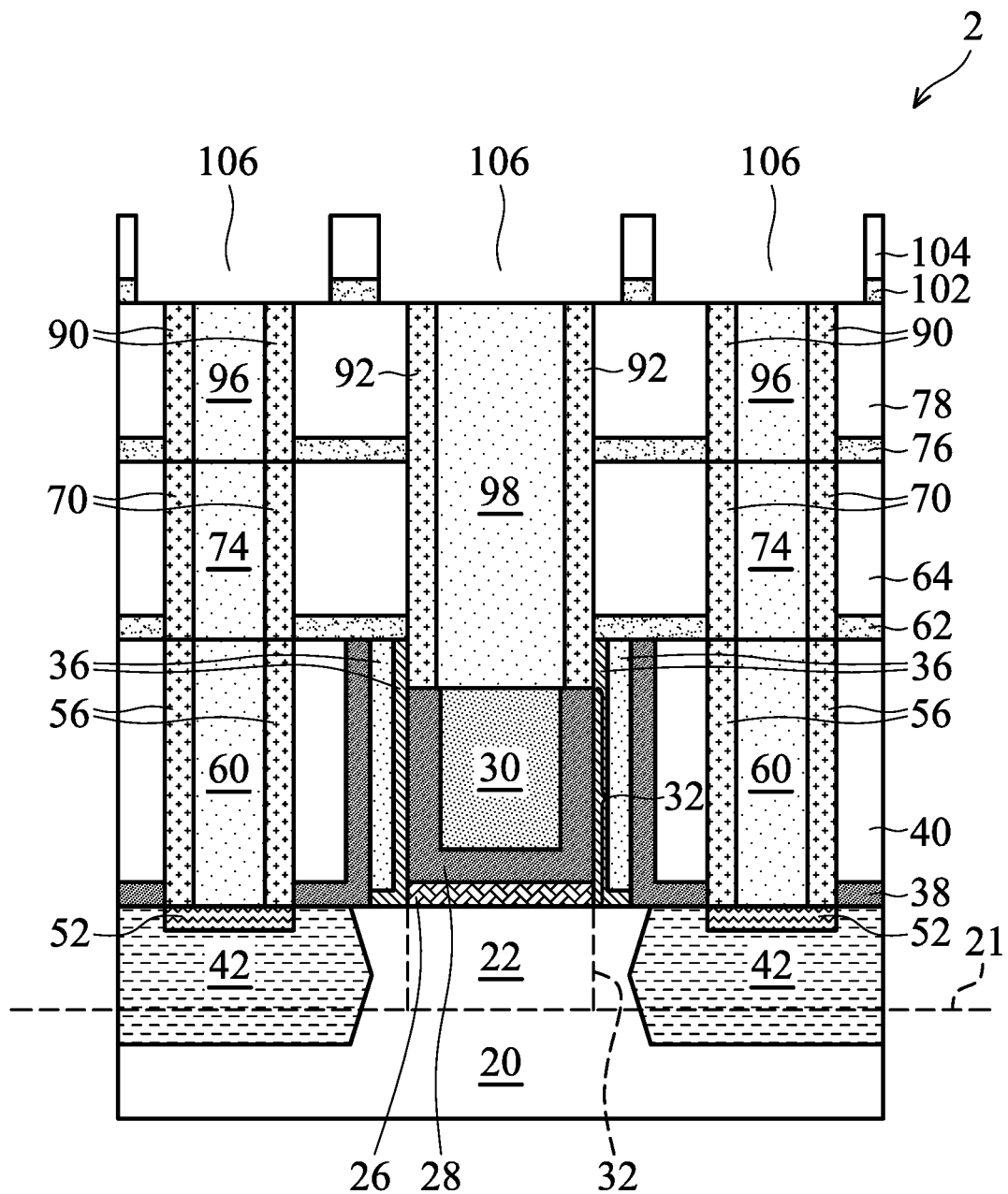
Figure 23:
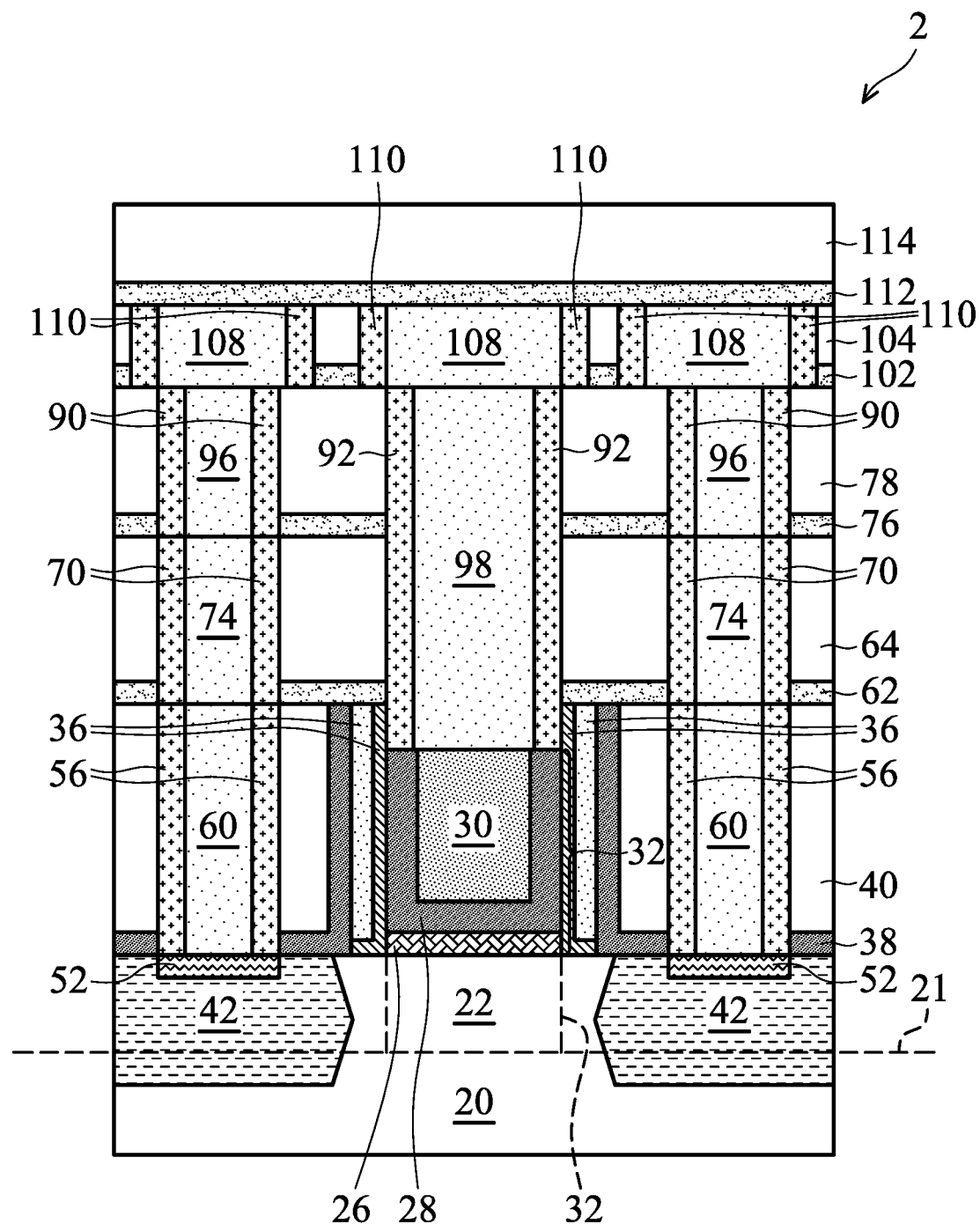

FIG. 22 illustrates the formation of trenches 106, wherein the formation includes etching low-k dielectric layer 104 and etch stop layer 102, hence exposing contact plugs 96 and 98. Next, as shown in FIG. 23, metal lines 108 and metal line spacers 110 are formed. The respective step is represented by step 218 in the process flow shown in FIG. 26. The formation process may be similar to the formation of contact spacers 70 and contact plugs 74, respectively, and the details of the formation process are not repeated herein. Metal line spacers 110 may be formed of a dielectric material selected from the same group of candidate materials for forming contact spacers 70. Metal lines 108 may include conductive diffusion barriers and a copper-containing metallic material over the conductive diffusion barriers.

Figure 24:
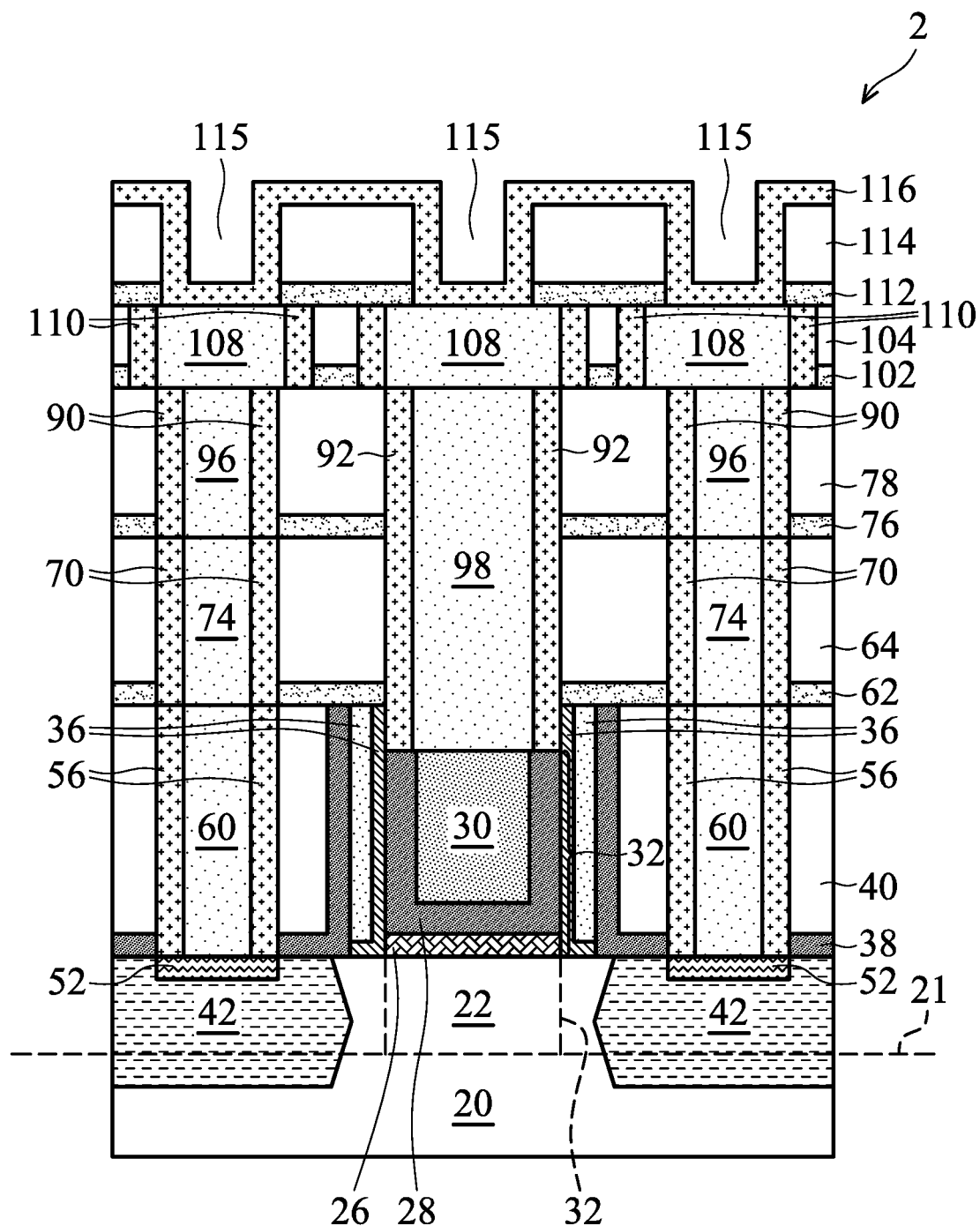

Next, vias are formed over metal lines 108 through a damascene process. Referring to FIG. 23, etch stop layer 112 and dielectric layer 114 are formed. In accordance with some embodiments of the present disclosure, etch stop layer 112 is formed of a material selected from the same group of candidate materials of etch stop layer 76 and 102, and dielectric layer 114 may be formed of a low-k dielectric material similar to the material of low-k dielectric layer 104. FIG. 24 illustrates the formation of via openings 115 and dielectric layer 116, which is a conformal layer or a substantially conformal layer deposited using ALD, CVD, or the like. Dielectric layer 116 extends into via openings 115.

Figure 25:
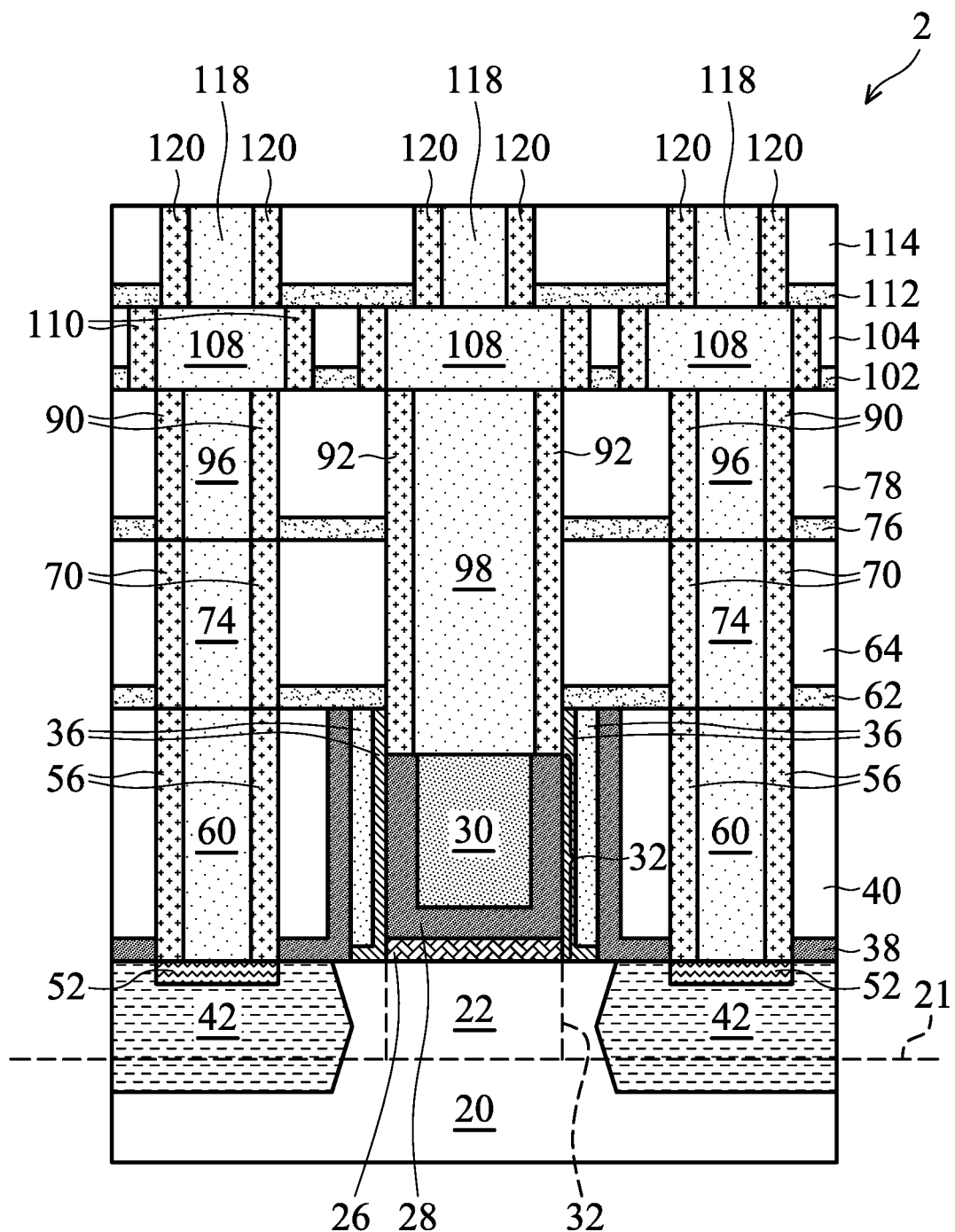
Figure 26:
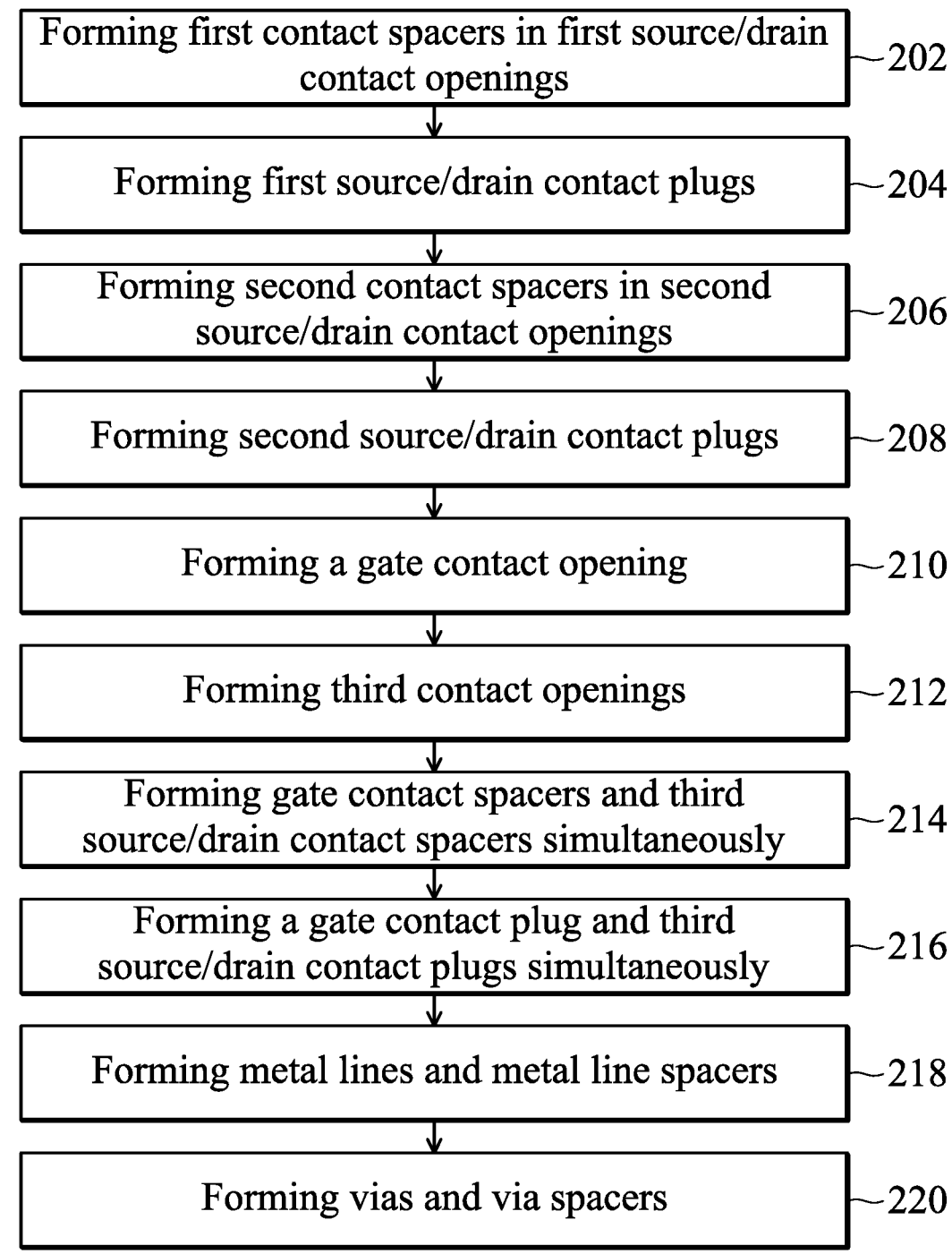
FIG. 26 illustrates a process flow for forming a transistor and the overlying interconnect structure in accordance with some embodiments.

FIG. 25 illustrates the formation of vias 118 and via spacers 120. The respective step is represented by step 220 in the process flow shown in FIG. 26. The formation process may be similar to the formation of contact spacers 70 and contact plugs 74, respectively, and the details of the formation process are not repeated herein. Via spacers 120 may be formed of a dielectric material selected from the same candidate materials for forming contact spacers 70. Vias 118 may include conductive diffusion barriers and a copper-containing metallic material over the respective conductive diffusion barriers. In subsequent processes, the process for forming metal lines 108, metal line spacers 110, vias 118, and via spacers 120 may be repeated to form overlying metal lines (such as M2, M3, M4 . . . through Mtop) and vias. The overlying metal lines and vias may be formed using single damascene processes (as shown in FIGS. 21 through 25) or dual damascene processes, with a dielectric layer deposited and anisotropically etched before the respective vias and metal lines are filled into the via openings and trenches, respectively.

The embodiments of the present application have some advantageous features. By forming contact spacers, metal line spacers, and/or via spacers, there are additional dielectric spacers for preventing the electrical shorting of underlying conductive features to the overlying conductive features if there is an overlay shift. The process window is thus increased.

In accordance with some embodiments of the present disclosure, a method includes forming a bottom source/drain contact plug in a bottom inter-layer dielectric. The bottom source/drain contact plug is electrically coupled to a source/drain region of a transistor. The method further includes forming an inter-layer dielectric overlying the bottom source/drain contact plug. A source/drain contact opening is formed in the inter-layer dielectric, with the bottom source/drain contact plug exposed through the source/drain contact opening. A dielectric spacer layer is formed to have a first portion extending into the source/drain contact opening and a second portion over the inter-layer dielectric. An anisotropic etching is performed on the dielectric spacer layer, and a remaining vertical portion of the dielectric spacer layer forms a source/drain contact spacer. The remaining portion of the source/drain contact opening is filled to form an upper source/drain contact plug.

In accordance with some embodiments of the present disclosure, a method includes forming first source/drain contact plug in a first inter-layer dielectric, and the first source/drain contact plug is electrically coupled to a source/drain region of a transistor, forming a second inter-layer dielectric overlying the first inter-layer dielectric, forming a second source/drain contact plug in the second inter-layer dielectric, forming a third inter-layer dielectric overlying the second inter-layer dielectric, and etching the second inter-layer dielectric and the third inter-layer dielectric to form a gate contact opening. A gate electrode of the transistor is exposed to the gate contact opening. A gate contact spacer is formed in the gate contact opening. The gate contact spacer penetrates through the second inter-layer dielectric and the third inter-layer dielectric. A gate contact plug is formed in the gate contact opening, and the gate contact plug is encircled by the gate contact spacer.

In accordance with some embodiments of the present disclosure, a device includes a semiconductor substrate, a gate electrode over the semiconductor substrate, a source/drain region on a side of the gate electrode, a first inter-layer dielectric over the source/drain region, with at least a portion of the gate electrode being in the first inter-layer dielectric, a second inter-layer dielectric overlying the first inter-layer dielectric, a third inter-layer dielectric overlying the second inter-layer dielectric, a gate contact spacer penetrating through the second inter-layer dielectric and the third inter-layer dielectric, and a gate contact plug electrically coupling to the gate electrode. The gate contact plug is encircled by the gate contact spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first inter-layer dielectric overlying a source/drain region of a transistor;
    forming a first source/drain contact opening in the first inter-layer dielectric;
        forming a first source/drain contact spacer in the first source/drain contact opening;
    filling a remaining portion of the first source/drain contact opening to form a first source/drain contact plug electrically coupling to the source/drain region;
    forming a first etch stop layer over and in contact with the first inter-layer dielectric, a gate spacer of the transistor and the first source/drain contact plug;
    forming a second inter-layer dielectric overlying and contacting the first etch stop layer;
    forming a second source/drain contact plug in the second inter-layer dielectric, wherein the second source/drain contact plug is over and contacting the first source/drain contact plug;
    forming a third inter-layer dielectric overlying the second inter-layer dielectric;
    etching the second inter-layer dielectric and the third inter-layer dielectric to form a gate contact opening, with a gate electrode of the transistor exposed through the gate contact opening;
    etching the third inter-layer dielectric, wherein a second source/drain contact opening is formed to reveal the second source/drain contact plug;
    simultaneously forming a gate contact spacer and a source/drain contact spacer extending into the gate contact opening and the second source/drain contact opening, respectively, wherein the gate contact spacer comprises an edge contacting an edge of the gate spacer to form a vertical interface; and
    filling remaining portions of the gate contact opening and the second source/drain contact opening simultaneously to form a gate contact plug and a third source/drain contact plug, respectively.

2. The method of claim 1 further comprising:
    filling the gate contact opening with a patterned photo resist, wherein the patterned photo resist is used as an etching mask when third inter-layer dielectric is etched to form the second source/drain contact opening; and
    removing the patterned photo resist before the gate contact plug and the third source/drain contact plug are formed.

3. The method of claim 1 further comprising:
    forming a first low-k dielectric layer over the third inter-layer dielectric;
    forming a metal line in the first low-k dielectric layer, wherein the metal line is electrically coupled to the source/drain region; and
    forming a dielectric metal line spacer encircling the metal line.

4. The method of claim 3 further comprising:
    forming a second low-k dielectric layer over the first low-k dielectric layer;
    forming a metal via in the second low-k dielectric layer, wherein the metal via is electrically coupled to the source/drain region; and
    forming a dielectric via spacer encircling the metal via.

5. The method of claim 1 further comprising:
    forming a sacrificial layer over a gate stack of the transistor;
    etching the sacrificial layer and the first inter-layer dielectric to form the first source/drain contact opening that extends into the sacrificial layer, wherein the first source/drain contact spacer and the first source/drain contact plug are formed in the first source/drain contact opening and extending into the sacrificial layer; and
    performing a planarization to remove the sacrificial layer and portions of the first source/drain contact spacer and the first source/drain contact plug in the sacrificial layer.

6. The method of claim 1, wherein the gate contact spacer comprises a bottom surface contacting a top surface of a gate dielectric, wherein the gate dielectric contacts the gate spacer.

7. The method of claim 1, wherein the gate contact spacer extends to a level lower than a top surface level of the first inter-layer dielectric.

8. The method of claim 1 further comprising etching a hard mask between the two gate spacers to extend the gate contact opening between the two gate spacers.

9. A method comprising:
    forming a first source/drain contact plug in a first inter-layer dielectric, wherein the first source/drain contact plug is electrically coupled to a source/drain region of a transistor;
    forming a second inter-layer dielectric overlying the first inter-layer dielectric;
    forming a second source/drain contact plug in the second inter-layer dielectric;
    forming a third inter-layer dielectric overlying the second inter-layer dielectric;
    etching the second inter-layer dielectric and the third inter-layer dielectric to form a gate contact opening, wherein a gate electrode of the transistor is exposed to the gate contact opening;
    after the second inter-layer dielectric and the third inter-layer dielectric are etched to form the gate contact opening, etching a hard mask between gate spacers of the transistor to extend the gate contact opening between the gate spacers;
    filling the gate contact opening with a photo resist;
    removing the photo resist from the gate contact opening;
    forming a gate contact spacer in the gate contact opening, wherein the gate contact spacer penetrates through the second inter-layer dielectric and the third inter-layer dielectric; and
    forming a gate contact plug in the gate contact opening, wherein the gate contact plug is encircled by the gate contact spacer.

10. The method of claim 9 further comprising:
    etching the third inter-layer dielectric using the photo resist as an etching mask to form a source/drain contact opening, wherein the second source/drain contact plug is exposed through the source/drain contact opening;
    forming a source/drain contact spacer in the source/drain contact opening; and
    forming a third source/drain contact plug in the source/drain contact opening, wherein the second source/drain contact plug is encircled by the source/drain contact spacer.

11. The method of claim 10, wherein the forming the gate contact spacer and the forming the source/drain contact spacer share a common deposition process and a common etching process.

12. The method of claim 9, wherein the forming the gate contact spacer comprises:
- depositing a dielectric spacer layer extending into the gate contact opening and penetrating through the second inter-layer dielectric and the third inter-layer dielectric; and
- performing an anisotropic etching on the dielectric spacer layer, wherein a remaining portion of the dielectric spacer layer forms the gate contact spacer.

13. The method of claim 9 wherein the gate contact spacer and the gate contact plug extend to a level lower than top surfaces of the gate spacers.

14. The method of claim 9 further comprising:
- forming a first low-k dielectric layer over the third inter-layer dielectric;
- forming a metal line in the first low-k dielectric layer, wherein the metal line is electrically coupled to the source/drain region; and
- forming a dielectric metal line spacer encircling the metal line.

15. The method of claim 14 further comprising:
- forming a second low-k dielectric layer over the first low-k dielectric layer;
- forming a via in the second low-k dielectric layer, wherein the via is electrically coupled to the source/drain region; and
- forming a dielectric via spacer encircling the via.

16. A method comprising:
- forming a replacement gate stack between two gate spacers, wherein the replacement gate stack and the two gate spacers are in a first Inter-Layer Dielectric (ILD);
- forming a hard mask overlapping the replacement gate stack, wherein the hard mask is also between the two gate spacers;
- forming a source/drain region on a side of the replacement gate stack;
- forming a second ILD over the first ILD;
- forming a first source/drain contact plug and a second source/drain contact plug in the first ILD and the second ILD, respectively;
- forming a third ILD over the second ILD:
- forming a source/drain contact opening in the third ILD;
- forming a gate contact opening in the third ILD and the second ILD; and
- forming a source/drain contact spacer and a gate contact spacer in the source/drain contact opening and the gate contact opening, respectively, wherein the source/drain contact spacer and the gate contact spacer are formed of a same dielectric material, and wherein the gate contact spacer contacts one of the two gate spacers.

17. The method of claim 16, wherein the forming the source/drain contact spacer and the gate contact spacer comprises:
- depositing a blanket dielectric layer extending into the gate contact opening and the source/drain contact opening; and
- performing an anisotropic etch on the blanket dielectric layer.

18. The method of claim 16, wherein the source/drain contact spacer has a bottom substantially coplanar with a top surface of the second ILD.

19. The method of claim 16 further comprising:
- simultaneously forming a gate contact plug and a third source/drain contact plug, wherein the gate contact plug is electrically connected to the replacement gate stack, and the third source/drain contact plug overlaps, and contacts, the second source/drain contact plug.

20. The method of claim 16 further comprising, after the forming the gate contact opening in the third ILD and the second ILD, etching the hard mask to extend the gate contact opening.

* * * * *